United States Patent
Yang et al.

(10) Patent No.: US 10,084,074 B1
(45) Date of Patent: Sep. 25, 2018

(54) COMPOUND SEMICONDUCTOR FIELD EFFECT TRANSISTOR GATE LENGTH SCALING

(71) Applicant: QUALCOMM Incorporated, San Diego, CA (US)

(72) Inventors: Bin Yang, San Diego, CA (US); Gengming Tao, San Diego, CA (US); Xia Li, San Diego, CA (US); Periannan Chidambaram, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/643,815

(22) Filed: Jul. 7, 2017

Related U.S. Application Data

(60) Provisional application No. 62/476,564, filed on Mar. 24, 2017.

(51) Int. Cl.
*H01L 29/423* (2006.01)
*H01L 29/778* (2006.01)
*H01L 29/66* (2006.01)

(52) U.S. Cl.
CPC ...... *H01L 29/778* (2013.01); *H01L 29/42312* (2013.01); *H01L 29/42376* (2013.01); *H01L 29/66431* (2013.01)

(58) Field of Classification Search
CPC ............... H01L 29/423; H01L 29/1778; H01L 29/42312; H01L 29/66431
See application file for complete search history.

(56) References Cited

U.S. PATENT DOCUMENTS

| | | |
|---|---|---|
| 6,294,446 B1 | 9/2001 | Ishikawa |
| 7,804,114 B1 | 9/2010 | Milosavljevic et al. |
| 8,039,903 B1 | 10/2011 | Milosavljevic et al. |
| 8,343,829 B2 | 1/2013 | Wang et al. |
| 8,383,471 B1 | 2/2013 | Shinihara et al. |
| 9,117,838 B2 | 8/2015 | Xu et al. |

(Continued)

FOREIGN PATENT DOCUMENTS

| | | |
|---|---|---|
| EP | 0592064 A2 | 4/1994 |
| WO | 2016024960 A1 | 2/2016 |

OTHER PUBLICATIONS

Cho S-J., et al., "Effects of Double Passivation for Optimize DC Properties in Gamma-Fate Algan/Gan High Electron Mobility Transistor by Plasma Enhanced Chemical Vapor Deposition", Thin Solid Films, Elsevier, Amsterdam, NL, vol. 520, No. 13, Feb. 8, 2012, pp. 4455-4458, XP028477850, ISSN: 0040-6090, DOI: 10.1016/J.TSF. 2012.02.055 [retrieved on Feb. 15, 2012].

(Continued)

*Primary Examiner* — Phuc Dang
(74) *Attorney, Agent, or Firm* — Seyfarth Shaw LLP

(57) ABSTRACT

A compound semiconductor transistor may include a channel layer. The compound semiconductor transistor may also include a dielectric layer on the channel layer. The compound semiconductor transistor may further include a gate. The gate may include a vertical base portion through the dielectric layer and electrically contacting the channel layer. The gate may also include a head portion on the dielectric layer and electrically coupled to the vertical base portion of the gate.

14 Claims, 32 Drawing Sheets

(56) References Cited

U.S. PATENT DOCUMENTS

| | | | |
|---|---|---|---|
| 2011/0147798 A1* | 6/2011 | Radosavljevic | H01L 21/2256 257/194 |
| 2013/0075722 A1* | 3/2013 | Yamazaki | H01L 29/41733 257/43 |
| 2013/0105817 A1* | 5/2013 | Saunier | H01L 29/778 257/77 |
| 2013/0277680 A1* | 10/2013 | Green | H01L 29/402 257/76 |
| 2013/0295757 A1 | 11/2013 | Xu et al. | |
| 2014/0017885 A1 | 1/2014 | Yoon et al. | |
| 2015/0021662 A1 | 1/2015 | Basu et al. | |
| 2015/0311084 A1 | 10/2015 | Moore et al. | |
| 2015/0357452 A1 | 12/2015 | Green et al. | |

OTHER PUBLICATIONS

Grebennikov A., "High-Efficiency Transmission-Line GaN HEMT Inverse Class F Power Amplifier for Active Antenna Arrays", Microwave Conference, 2009, APMC 2009, Asia Pacific, IEEE, Piscataway, NJ, USA, Dec. 7, 2009, pp. 317-320, XP031614118, ISBN: 978-1-4244-2801-4.
International Search Report and Written Opinion—PCT/US2018/016251—ISA/EPO—dated May 4, 2018.

* cited by examiner

US 10,084,074 B1

COMPOUND SEMICONDUCTOR FIELD EFFECT TRANSISTOR GATE LENGTH SCALING

CROSS-REFERENCE TO RELATED APPLICATION

This application claims the benefit of U.S. Provisional Patent Application No. 62/476,564, filed on Mar. 24, 2017, and entitled "COMPOUND SEMICONDUCTOR FIELD EFFECT TRANSISTOR GATE LENGTH SCALING WITH SELF-ALIGNED GATE," the disclosure of which is expressly incorporated by reference herein in its entirety.

BACKGROUND

Field

The present disclosure relates generally to wireless communication systems and, more specifically, to a compound semiconductor field effect transistor (FET) including gate length scaling with a self-aligned gate.

Background

A wireless device (e.g., a cellular phone or a smartphone) in a wireless communication system may include a radio frequency (RF) transceiver to transmit and receive data for two-way communication. A mobile RF transceiver may include a transmit section for data transmission and a receive section for data reception. For data transmission, the transmit section may modulate an RF carrier signal with data to obtain a modulated RF signal, amplify the modulated RF signal to obtain an amplified RF signal having the proper output power level, and transmit the amplified RF signal via an antenna to a base station. For data reception, the receive section may obtain a received RF signal via the antenna and may amplify and process the received RF signal to recover data sent by the base station.

The transmit section of the mobile RF transceiver may amplify and transmit a communication signal. The transmit section may include one or more circuits for amplifying and transmitting the communication signal. The amplifier circuits may include one or more amplifier stages that may have one or more driver stages and one or more power amplifier stages. Each of the amplifier stages includes one or more transistors configured in various ways to amplify the communication signal. The transistors configured to amplify the communication signal are generally selected to operate at substantially higher frequencies for supporting communication enhancements, such as carrier aggregation. These transistors are commonly implemented using compound semiconductor transistors, such as bipolar junction transistors (BJTs), heterojunction bipolar transistors (HBTs), high electron mobility transistors (HEMTs), pseudomorphic high electron mobility transistors (pHEMTs), and the like.

Further design challenges for mobile RF transceivers include performance considerations for meeting future 5G and 5G+ transmission frequency specifications. These future 5G/5G+ performance specifications mandate a ten-fold transmission frequency increase (e.g., 28 GHz to 86 GHz) over current standards. Unfortunately, current compound semiconductor transistors are unable to meet these future 5G/5G+ performance specifications.

SUMMARY

A compound semiconductor transistor may include a channel layer. The compound semiconductor transistor may also include a dielectric layer on the channel layer. The compound semiconductor transistor may further include a gate. The gate may include a vertical base portion through the dielectric layer and electrically contacting the channel layer. The gate may also include a head portion on the dielectric layer and electrically coupled to the vertical base portion of the gate.

A method of making a compound semiconductor field effect transistor (FET) may include forming an oxide layer on a channel layer. The method may also include etching through the oxide layer to form an opening. The method may further include depositing a first conductive gate material at least in the opening to provide a vertical base portion of a gate. The method may also include depositing a second conductive gate material on a portion of the first conductive gate material supported by the oxide layer to provide a head portion of the gate.

A radio frequency (RF) front end module may include a chip. The chip may include a compound semiconductor transistor, comprising a channel layer, a dielectric layer on the channel layer, and a gate. The gate may include a vertical base portion through the dielectric layer and electrically contacting the channel layer. The gate may also include a head portion on the dielectric layer and electrically coupled to the vertical base portion of the gate. The RF may also include an antenna coupled to an output of the chip.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

DETAILED DESCRIPTION

Figure 1:
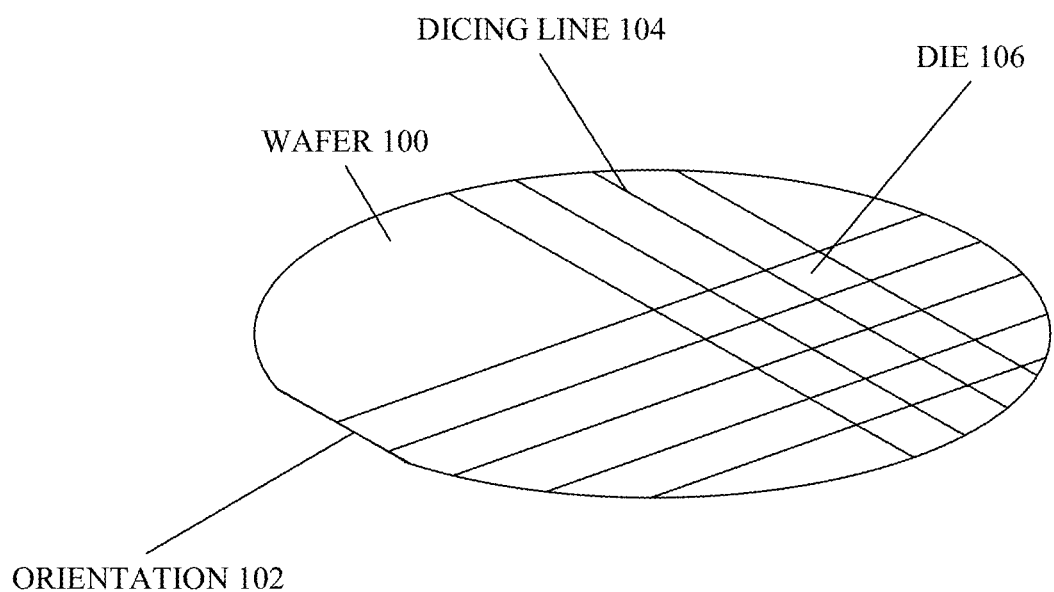
FIG. 1 illustrates a perspective view of a semiconductor wafer.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts.

As described herein, the use of the term "and/or" is intended to represent an "inclusive OR," and the use of the term "or" is intended to represent an "exclusive OR." As described herein, the term "exemplary" used throughout this description means "serving as an example, instance, or illustration," and should not necessarily be construed as preferred or advantageous over other exemplary configurations. The term "coupled" used throughout this description means "connected, whether directly or indirectly through intervening connections (e.g., a switch), electrical, mechanical, or otherwise," and is not necessarily limited to physical connections. Additionally, the connections can be such that the objects are permanently connected or releasably connected. The connections can be through switches.

Fabrication of mobile radio frequency (RF) chips (e.g., mobile RF transceivers) becomes complex at deep submicron process nodes due to cost and power consumption considerations. A mobile RF transceiver may include a transmit section for data transmission and a receive section for data reception. For data transmission, the transmit section may modulate an RF carrier signal with data to obtain a modulated RF signal, amplify the modulated RF signal to obtain an amplified RF signal having the proper output power level, and transmit the amplified RF signal via an antenna to a base station. For data reception, the receive section may obtain a received RF signal via the antenna and may amplify and process the received RF signal to recover data sent by the base station.

The transmit section of the mobile RF transceiver may amplify and transmit a communication signal. The transmit section may include one or more circuits for amplifying and transmitting the communication signal. The amplifier circuits may include one or more amplifier stages that may have one or more driver stages and one or more power amplifier stages. Each of the amplifier stages includes one or more transistors configured in various ways to amplify the communication signal.

The transistors configured to amplify the communication signal are generally selected to operate at substantially higher frequencies for supporting communication enhancements, such as carrier aggregation. These transistors are commonly implemented using compound semiconductor transistors, such as bipolar junction transistors (BJTs), heterojunction bipolar transistors (HBTs), high electron mobility transistors (HEMTs), pseudomorphic high electron mobility transistors (PHEMTs), and the like.

Further design challenges for mobile RF transceivers include performance considerations for meeting future 5G and 5G+ transmission frequency specifications. These future 5G/5G+ performance specifications mandate a ten-fold transmission frequency increase (e.g., 28 GHz to 86 GHz) over current standards. Unfortunately, current compound semiconductor transistors solutions, such as bipolar transistors are unable to meet these future 5G/5G+ performance specifications.

Bipolar transistors, which are also referred to as bipolar junction transistors (BJTs), are a type of transistor that uses both hole charge and electron carriers. Bipolar transistors are fabricated in integrated circuits and are also used as individual components. Bipolar transistors are designed to amplify current. This basic function of bipolar transistors makes them a logical choice for implementing amplifiers and switches. As a result, bipolar transistors are widely used in electronic equipment, such as cellular phones, audio amplifiers, and radio transmitters.

A heterojunction bipolar transistor (HBT) is a type of bipolar transistor that uses different semiconductor materials for emitters and base regions of the device, which create a heterojunction. A heterojunction bipolar transistor may use a III-V compound semiconductor material, a II-VI compound semiconductor material, or other like compound semiconductor material. The III-V (and II-VI) compound semiconductor materials generally exhibit high carrier mobility and direct energy gaps. Heterojunction bipolar transistors improve upon bipolar transistors by supporting substantially higher frequencies (e.g., up to several hundred gigahertz (GHz)). Heterojunction bipolar transistors are, therefore, often used in high speed circuits, such as RF chip designs including RF power amplifiers in mobile RF transceivers. Unfortunately, heterojunction bipolar transistors are also unable to meet future 5G/5G+ performance specifications.

A high electron mobility transistor (HEMT) is a type of field effect transistor (FET) that relies on a junction between different semiconductor materials with different bandgaps to form a heterojunction. A high electron mobility transistor may also use a III-V compound semiconductor material, a II-VI compound semiconductor material, or other like compound semiconductor material, which exhibits high carrier mobility and direct energy gaps. High electron mobility transistors rely on an epitaxial structure, in which layers with different band gaps are grown on a compound semiconductor substrate to form heterojunctions. High electron mobility transistors improve upon heterojunction transistors by supporting substantially higher transmission frequencies, which may meet future 5G/5G+ performance specifications.

For example, a compound semiconductor (e.g., GaAs) pseudomorphic high electron mobility transistor (pHEMT) may support a transmission frequency (Ft)/maximum frequency (Fmax) in excess of one-hundred gigahertz (e.g., Ft/Fmax>100 GHz). The increased transmission frequency supported by a pseudomorphic high-electron-mobility transistor, however, relies on an electron beam (e-beam) process to scale a gate length (Lgate) to approximately one-tenth of a micrometer (e.g., ~0.1 um).

Unfortunately, the electron beam process used to scale the gate length Lgate of pseudomorphic high electron mobility transistors is expensive and provides low throughput. Similarly, although an indium phosphide (InP) heterojunction bipolar transistor may support a transmission frequency/maximum frequency in excess of three-hundred gigahertz (e.g., Ft/Fmax>300 GHz), this device is also inadequate because the substrate and epitaxial layers are at least five times more expensive than GaAs compound semiconductor materials. In addition, gallium nitride (GaN) high electron mobility transistors, which also support a transmission frequency/maximum frequency in excess of one-hundred gigahertz (e.g., Ft/Fmax>100 GHz) similarly rely on substrate and epitaxial layers that are at least five times more expensive than GaAs compound semiconductor materials. Gallium nitride high electron mobility transistors are also immature devices.

Successful fabrication of modern semiconductor chip products, such as compound semiconductor bipolar transistors and field effect transistors (FETs) involves interplay between the materials and the processes employed. The process flow for semiconductor fabrication of the integrated circuit structure may include front-end-of-line (FEOL) processes, middle-of-line (MOL) (also referred to as middle-end-of-line (MEOL)) processes, and back-end-of-line (BEOL) processes to form interconnects (e.g., M1, M2, M3, M4, etc.) The front-end-of-line processes may include the set of process steps that form the active devices, such as transistors, capacitors, and diodes.

The front-end-of-line processes include ion implantation, anneals, oxidation, chemical vapor deposition (CVD) or atomic layer deposition (ALD), etching, chemical mechanical polishing (CMP), and epitaxy. The middle-of-line processes may include the set of process steps that enable connection of the transistors to back-end-of-line interconnects. These steps include silicidation and contact formation as well as stress introduction. The back-end-of-line processes may include the set of process steps that form the interconnects that tie the independent transistors and form circuits.

While heterojunction bipolar transistors and pseudomorphic high electron mobility transistors offer possible solutions to meeting future 5G/5G+ performance specifications, these transistors suffer from gate scaling issues and/or gate alignment issues noted above. For example, conventional compound semiconductor (e.g., GaAs, InP, and GaN) high electron mobility transistors are generally fabricated without self-aligned gates. The lack of self-aligned gates may be due to space limitations with regards to conventional processing steps. In addition, compound semiconductor heterojunction bipolar transistors that meet future 5G/5G+ performance specifications rely on compound semiconductor materials that are at least five times more expensive than conventional compound semiconductor materials. Therefore, a desire exists for a device and process that scale a gate length (Lgate) and provide for self-aligned gates to overcome the challenges described above.

Aspects of the present disclosure are directed to an innovative compound semiconductor FET having a gate (e.g., an asymmetric T-gate or a gamma gate) fabricated with a reduced gate length (Lgate). In one aspect, the gate is symmetrical. The reduced gate length Lgate may be reduced to a predetermined range (e.g., ~10 nanometers to ~0.1 microns), without using either an electron-beam or immersion lithography. Such a device and method enable a low cost compound semiconductor FET (e.g., a gallium arsenide (GaAs)) pseudomorphic high electron mobility transistor (pHEMTs) device for 5G wireless. The compound semiconductor FET may include a gate having a vertical base portion through a dielectric (e.g., oxide) layer and a head portion on the dielectric layer. The head portion of the gate may be an asymmetric T-gate, a gamma gate, or other like asymmetric, or symmetric gate configuration.

Figure 4:
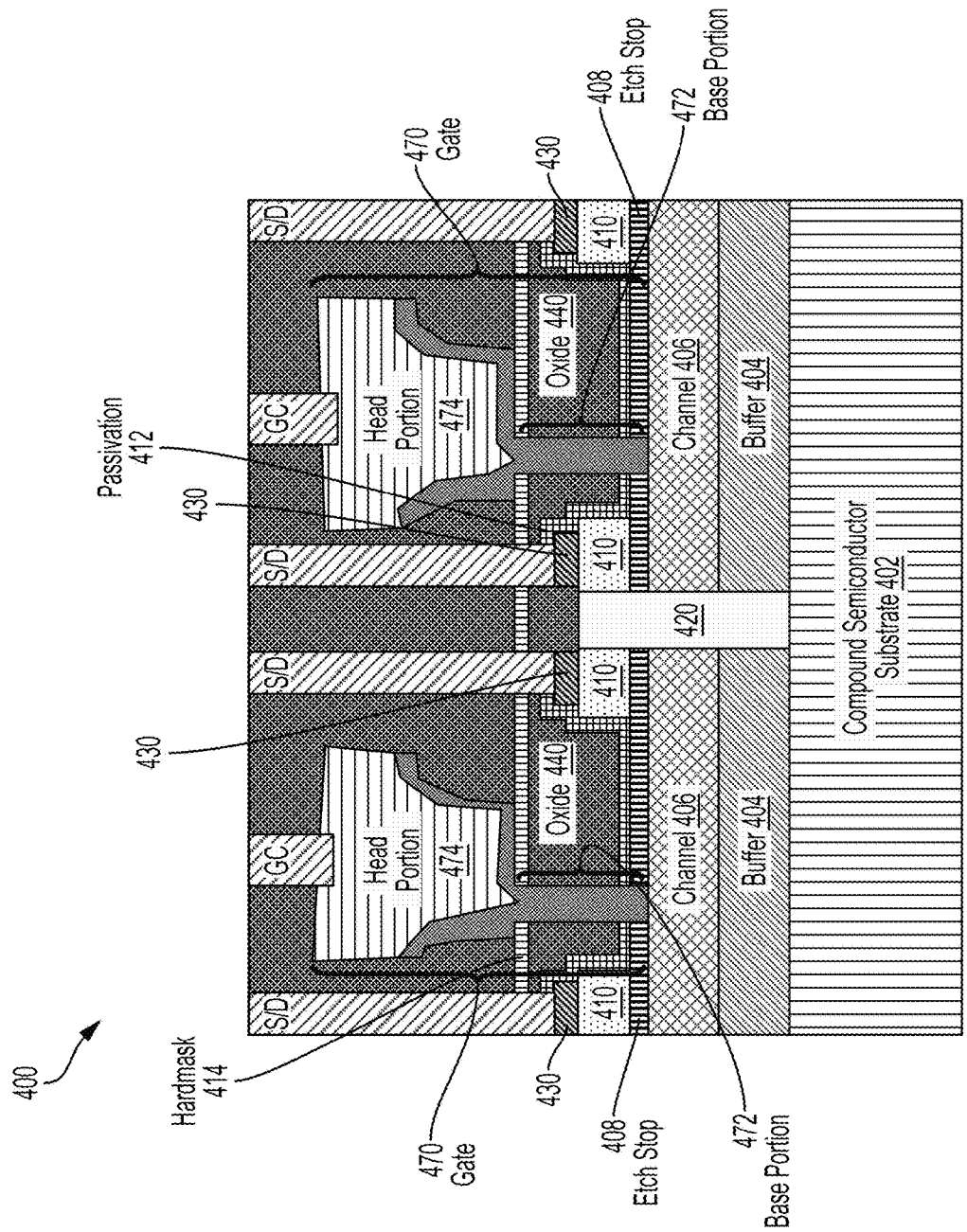
FIG. 4 illustrates a compound semiconductor field effect transistor (FET) having a scaled gate length according to aspects of the present disclosure.
Figure 5A:
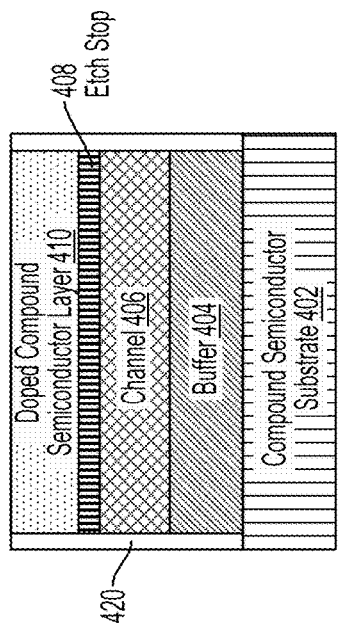
FIGS. 5A-5V illustrate formation of the compound semiconductor field effect transistor (FET) of FIG. 4 according to aspects of the present disclosure.
Figure 5V:
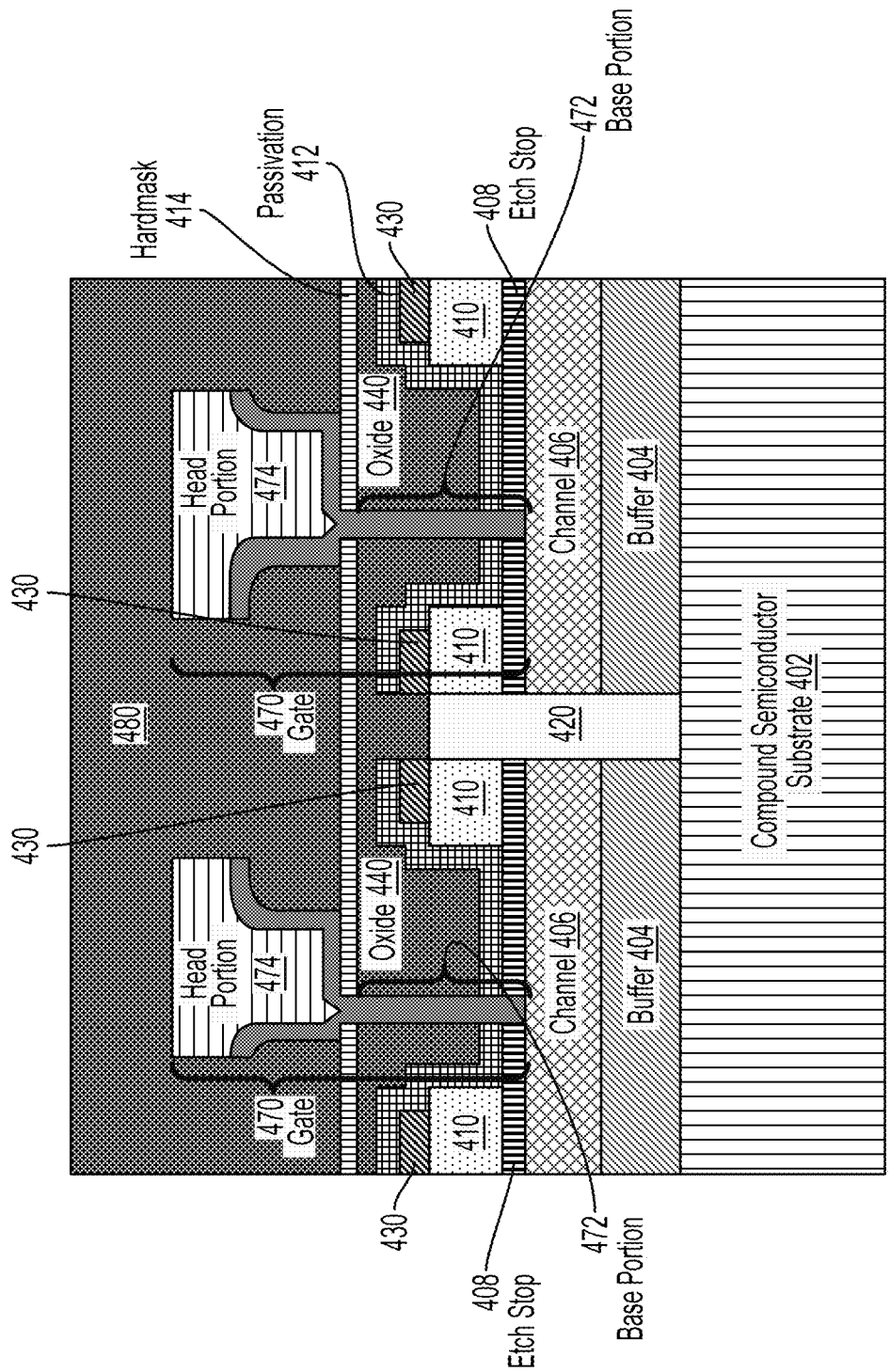
Figure 6:
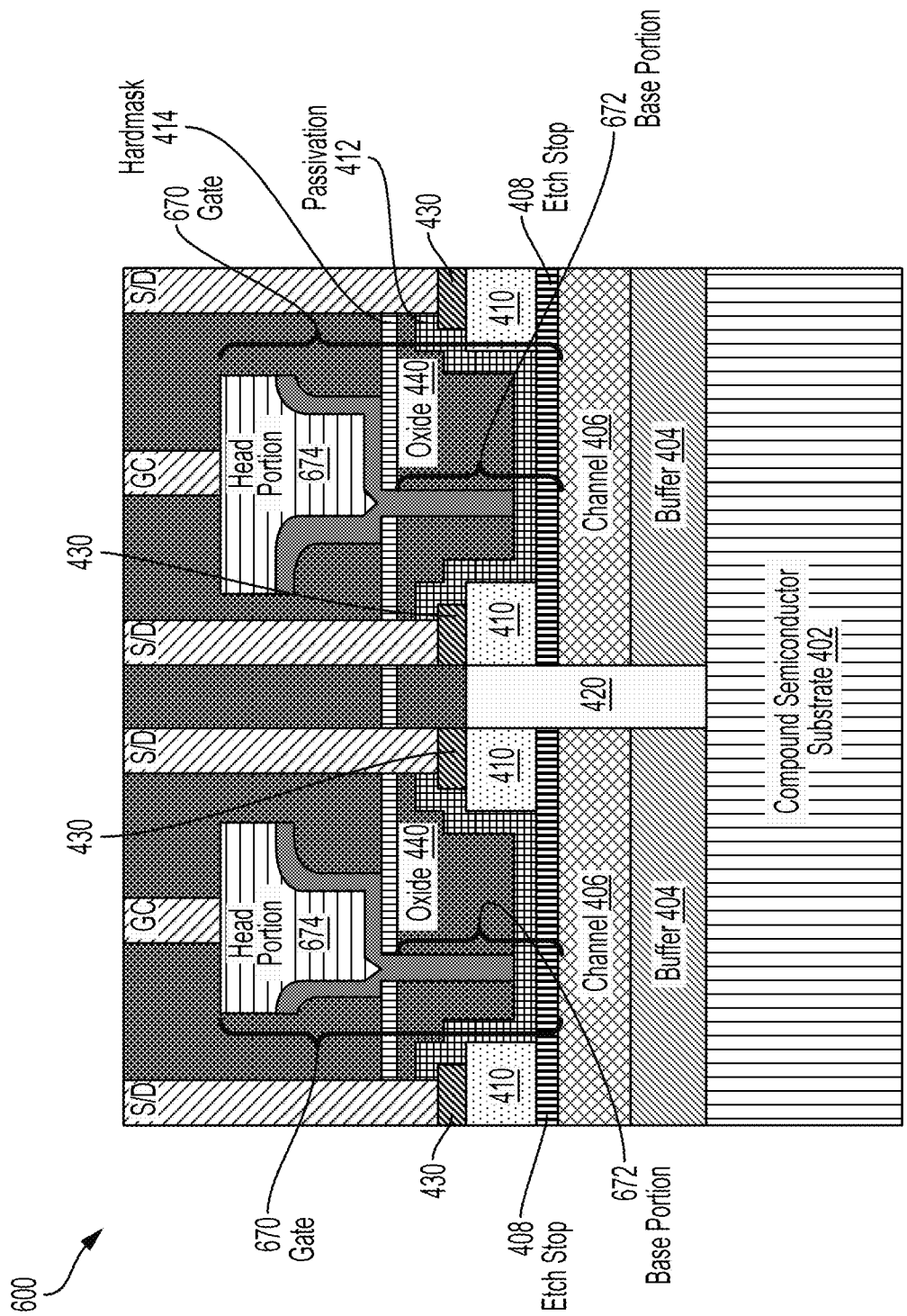
FIG. 6 illustrates a compound semiconductor field effect transistor (FET) having a scaled gate length according to further aspects of the present disclosure.

According to aspects of the present disclosure, the dielectric layer is an oxide layer, which may be a complementary metal oxide semiconductor (CMOS) compatible spin on oxide that is liquid at room temperature. The liquid oxide may be subject to a planarization coating process followed by a bake process (e.g., 400° C.) to form a solid spin-on oxide (dielectric) layer for supporting a reduced gate length (Lgate). A reduced Lgate process is shown in FIGS. 5A-5V for fabricating a Schottky gate compound semiconductor transistor, for example, as shown in FIG. 4. According to a further aspect of the present disclosure, an alternative process for fabricating a MOSFET gate compound semiconductor transistor shown in FIG. 6 is illustrated in FIGS. 7A-7G. FIGS. 5A-5O of the reduced gate length process for fabricating a Schottky gate compound semiconductor transistor are also part of the fabrication process of the reduced gate length MOSFET compound semiconductor transistor of FIG. 6.

FIG. 1 illustrates a perspective view of a semiconductor wafer. A wafer 100 may be a semiconductor wafer, or may be a substrate material with one or more layers of semiconductor material on a surface of the wafer 100. When the wafer 100 is a semiconductor material, it may be grown from a seed crystal using the Czochralski process, where the seed crystal is dipped into a molten bath of semiconductor material and slowly rotated and removed from the bath. The molten material then crystalizes onto the seed crystal in the orientation of the crystal.

The wafer 100 may be composed of a compound semiconductor material, such as gallium arsenide (GaAs, InP) or gallium nitride (GaN), a ternary material such as indium gallium arsenide (InGaAs, AlGaAs, InGaSb), quaternary materials (InGaAsP), or any material that can be a substrate material for other compound semiconductor materials. Although many of the materials may be crystalline in nature, polycrystalline or amorphous materials may also be used for the wafer 100.

The wafer 100, or layers that are coupled to the wafer 100, may be supplied with materials that make the wafer 100 more conductive. For example, and not by way of limitation, a silicon wafer may have phosphorus or boron added to the wafer 100 to allow for electrical charge to flow in the wafer 100. These additives are referred to as dopants, and provide extra charge carriers (either electrons or holes) within the wafer 100 or portions of the wafer 100. By selecting the areas where the extra charge carriers are provided, which type of charge carriers are provided, and the amount (density) of additional charge carriers in the wafer 100, different types of electronic devices may be formed in or on the wafer 100.

The wafer 100 has an orientation 102 that indicates the crystalline orientation of the wafer 100. The orientation 102 may be a flat edge of the wafer 100 as shown in FIG. 1, or may be a notch or other indicia to illustrate the crystalline orientation of the wafer 100. The orientation 102 may indicate the Miller Indices for the planes of the crystal lattice in the wafer 100.

After the wafer 100 is processed as desired, the wafer 100 is divided up along dicing lines 104. The dicing lines 104 indicate where the wafer 100 is to be broken apart or separated into pieces. The dicing lines 104 may define the outline of the various integrated circuits that have been fabricated on the wafer 100.

Once the dicing lines 104 are defined, the wafer 100 may be sawed or otherwise separated into pieces to form die 106. Each of the die 106 may be an integrated circuit with many devices or may be a single electronic device. The physical size of the die 106, which may also be referred to as a chip or a semiconductor chip, depends at least in part on the ability to separate the wafer 100 into certain sizes, as well as the number of individual devices that the die 106 is designed to contain.

After the wafer 100 is separated into one or more die 106, the die 106 may be mounted into packaging to allow access to the devices and/or integrated circuits fabricated on the die 106. Packaging may include single in-line packaging, dual in-line packaging, motherboard packaging, flip-chip packaging, indium dot/bump packaging, or other types of devices that provide access to the die 106. The die 106 may also be directly accessed through wire bonding, probes, or other connections without mounting the die 106 into a separate package.

Figure 2:
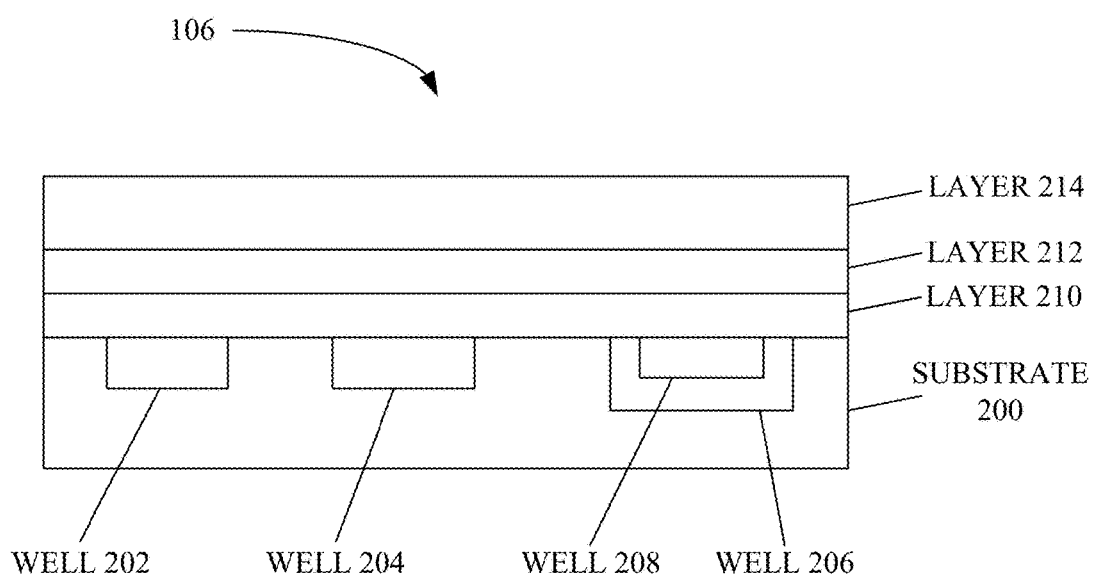
FIG. 2 illustrates a cross-sectional view of a die.

FIG. 2 illustrates a cross-sectional view of a die 106. In the die 106, there may be a substrate 200, which may be a semiconductor material and/or may act as a mechanical support for electronic devices. The substrate 200 may be a doped semiconductor substrate, which has either electrons (designated N-channel) or holes (designated P-channel) charge carriers present throughout the substrate 200. Subsequent doping of the substrate 200 with charge carrier ions/atoms may change the charge carrying capabilities of the substrate 200.

The semiconductor substrate may also have a well 206 and a well 208. The well 208 may be completely within the well 206, and, in some cases, may form a bipolar junction transistor (BJT), a heterojunction bipolar transistor (HBT), a high electron mobility transistor (HEMT), a pseudomorphic HEMT (pHEMT), or other like compound semiconductor transistor. The well 206 may also be used as an isolation well to isolate the well 208 from electric and/or magnetic fields within the die 106.

Layers (e.g., 210 through 214) may be added to the die 106. The layer 210 may be, for example, an oxide or insulating layer that may isolate the wells (e.g., 202-208) from each other or from other devices on the die 106. In such cases, the layer 210 may be silicon dioxide, a polymer, a dielectric, or another electrically insulating layer. The layer 210 may also be an interconnection layer, in which case it may comprise a conductive material such as copper, tungsten, aluminum, an alloy, or other conductive or metallic materials.

The layer 212 may also be a dielectric or conductive layer, depending on the desired device characteristics and/or the materials of the layers (e.g., 210 and 214). The layer 214 may be an encapsulating layer, which may protect the layers (e.g., 210 and 212), as well as the wells 202-208 and the substrate 200, from external forces. For example, and not by way of limitation, the layer 214 may be a layer that protects the die 106 from mechanical damage, or the layer 214 may be a layer of material that protects the die 106 from electromagnetic or radiation damage.

Electronic devices designed on the die 106 may comprise many features or structural components. For example, the die 106 may be exposed to any number of methods to impart dopants into the substrate 200, the wells 202-208, and, if desired, the layers (e.g., 210-214). For example, and not by way of limitation, the die 106 may be exposed to ion implantation, deposition of dopant atoms that are driven into a crystalline lattice through a diffusion process, chemical vapor deposition, epitaxial growth, or other methods. Through selective growth, material selection, and removal of portions of the layers (e.g., 210-214), and through selective removal, material selection, and dopant concentration of the substrate 200 and the wells 202-208, many different structures and electronic devices may be formed within the scope of the present disclosure.

Further, the substrate 200, the wells 202-208, and the layers (e.g., 210-214) may be selectively removed or added through various processes. Chemical wet etching, chemical mechanical planarization (CMP), plasma etching, photoresist masking, damascene processes, and other methods may create the structures and devices of the present disclosure.

A heterojunction bipolar transistor (HBT) is a type of bipolar transistor that uses different semiconductor materials for emitters and base regions of the device, which creates a heterojunction. A heterojunction bipolar transistor may use a III-V compound semiconductor material, a II-VI compound semiconductor material, or other like compound semiconductor material. The III-V (and II-VI) compound semiconductor materials generally exhibit high carrier mobility and direct energy gaps. Heterojunction bipolar transistors improve upon bipolar transistors by supporting substantially higher frequencies (e.g., up to several hundred gigahertz (GHz)). Heterojunction bipolar transistors are, therefore, often used in high speed circuits, such as RF chip designs including RF power amplifiers in mobile RF transceivers of a radio frequency (RF) front end module, for example, as shown in FIG. 3.

Figure 3:
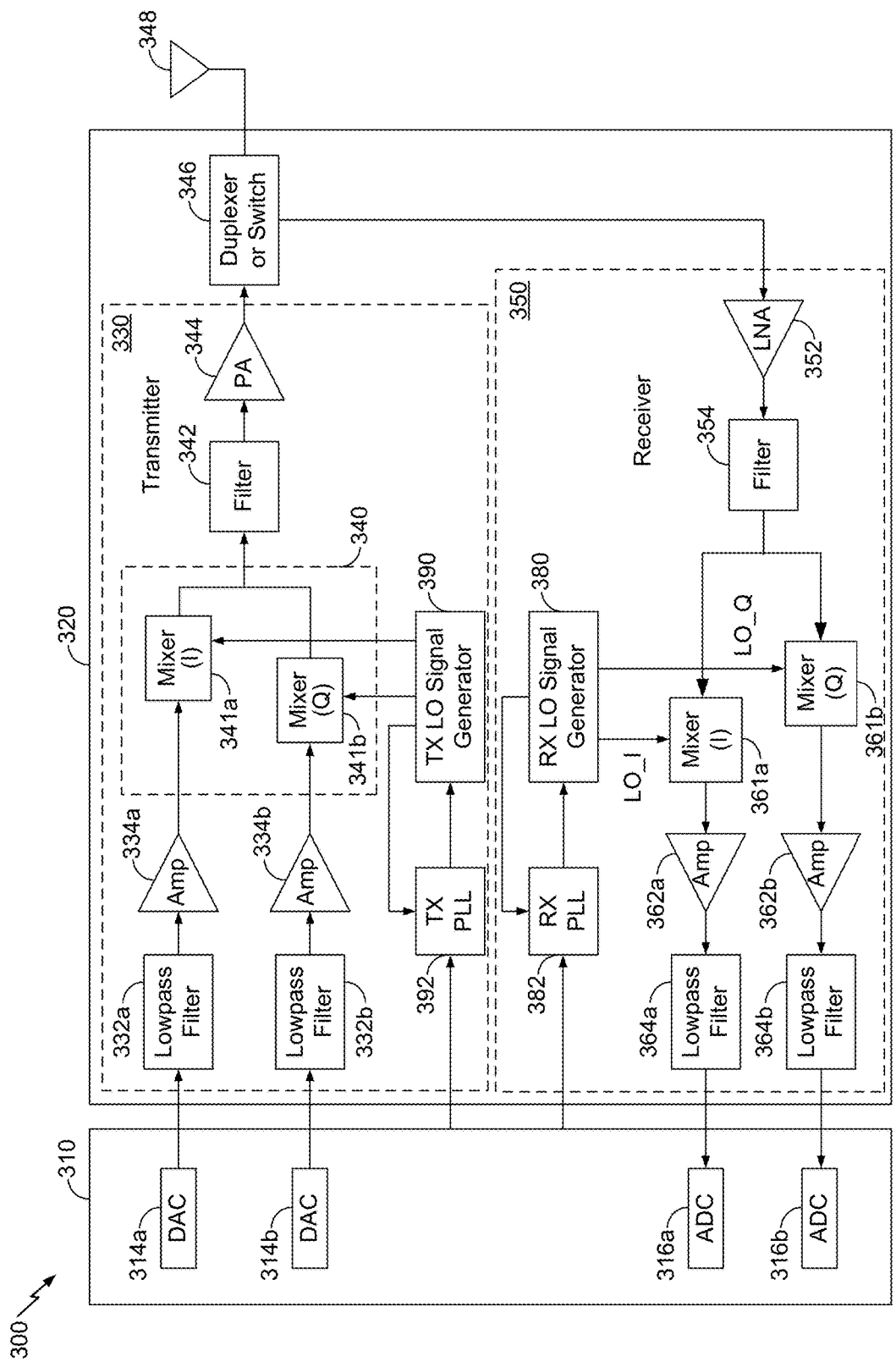
FIG. 3 shows a block diagram of an exemplary wireless device.

FIG. 3 shows a block diagram of an exemplary design of a wireless device 300. FIG. 3 shows an example of a transceiver 320, which may be a wireless transceiver (WTR). In general, the conditioning of the signals in a transmitter 330 and a receiver 350 may be performed by one or more stages of amplifier(s), filter(s), upconverters, downconverters, and the like. These circuit blocks may be arranged differently from the configuration shown in FIG. 3. Furthermore, other circuit blocks not shown in FIG. 3 may also be used to condition the signals in the transmitter 330 and receiver 350. Unless otherwise noted, any signal in FIG. 3, or any other figure in the drawings, may be either single-ended or differential. Some circuit blocks in FIG. 3 may also be omitted.

In the example shown in FIG. 3, the wireless device 300 generally includes the transceiver 320 and a data processor 310. The data processor 310 may include a memory (not shown) to store data and program codes, and may generally include analog and digital processing elements. The transceiver 320 may include the transmitter 330 and receiver 350 that support bi-directional communication. In general, the wireless device 300 may include any number of transmitters and/or receivers for any number of communication systems and frequency bands. All or a portion of the transceiver 320 may be implemented on one or more analog integrated circuits (ICs), radio frequency (RF) integrated circuits (RFICs), mixed-signal ICs, and the like.

A transmitter or a receiver may be implemented with a super-heterodyne architecture or a direct-conversion architecture. In the super-heterodyne architecture, a signal is frequency-converted between radio frequency and baseband in multiple stages, e.g., from radio frequency to an intermediate frequency (IF) in one stage, and then from intermediate frequency to baseband in another stage for a receiver. In the direct-conversion architecture, a signal is frequency converted between radio frequency and baseband in one stage. The super-heterodyne and direct-conversion architectures may use different circuit blocks and/or have different requirements. In the example shown in FIG. 3, the transmitter 330 and the receiver 350 are implemented with the direct-conversion architecture.

In a transmit path, the data processor 310 processes data to be transmitted. The data processor 310 also provides in-phase (I) and quadrature (Q) analog output signals to the transmitter 330 in the transmit path. In an exemplary aspect, the data processor 310 includes digital-to-analog-converters (DACs) 314a and 314b for converting digital signals generated by the data processor 310 into the in-phase (I) and quadrature (Q) analog output signals (e.g., I and Q output currents) for further processing.

Within the transmitter 330, lowpass filters 332a and 332b filter the in-phase (I) and quadrature (Q) analog transmit signals, respectively, to remove undesired images caused by the prior digital-to-analog conversion. Amplifiers (Amp) 334a and 334b amplify the signals from lowpass filters 332a and 332b, respectively, and provide in-phase (I) and quadrature (Q) baseband signals. Upconversion mixers 341a and 341b of an upconverter 340 upconverts the in-phase (I) and quadrature (Q) baseband signals with in-phase (I) and quadrature (Q) transmit (TX) local oscillator (LO) signals from a TX LO signal generator 390 to provide an upconverted signal. A filter 342 filters the upconverted signal to remove undesired images caused by the frequency upconversion as well as noise in a receive frequency band. A power amplifier (PA) 344 amplifies the signal from the filter 342 to obtain the desired output power level and provides a transmit radio frequency signal. The transmit radio frequency signal is routed through a duplexer/switch 346 and transmitted via an antenna 348.

In a receive path, the antenna 348 receives communication signals and provides a received radio frequency (RF) signal, which is routed through the duplexer/switch 346 and provided to a low noise amplifier (LNA) 352. The duplexer/switch 346 is designed to operate with a specific receive (RX) to transmit (TX) (RX-to-TX) duplexer frequency separation, such that RX signals are isolated from TX signals. The received RF signal is amplified by the LNA 352 and filtered by a filter 354 to obtain a desired RF input signal. Downconversion mixers 361a and 361b mix the output of the filter 354 with in-phase (I) and quadrature (Q) receive (RX) LO signals (i.e., LO_I and LO_Q) from an RX LO signal generator 380 to generate in-phase (I) and quadrature (Q) baseband signals. The in-phase (I) and quadrature (Q) baseband signals are amplified by amplifiers 362a and 362b and further filtered by lowpass filters 364a and 364b to obtain in-phase (I) and quadrature (Q) analog input signals, which are provided to the data processor 310. In the exemplary configuration shown, the data processor 310 includes analog-to-digital-converters (ADCs) 316a and 316b for converting the analog input signals into digital signals for further processing by the data processor 310.

In FIG. 3, the transmit local oscillator (TX LO) signal generator 390 generates the in-phase (I) and quadrature (Q) TX LO signals used for frequency upconversion, while a receive local oscillator (RX LO) signal generator 380 generates the in-phase (I) and quadrature (Q) RX LO signals used for frequency downconversion. Each LO signal is a periodic signal with a particular fundamental frequency. A phase locked loop (PLL) 392 receives timing information from the data processor 310 and generates a control signal used to adjust the frequency and/or phase of the TX LO signals from the TX LO signal generator 390. Similarly, a PLL 382 receives timing information from the data processor 310 and generates a control signal used to adjust the frequency and/or phase of the RX LO signals from the RX LO signal generator 380.

The wireless device 300 may support carrier aggregation and may (i) receive multiple downlink signals transmitted by one or more cells on multiple downlink carriers at different frequencies and/or (ii) transmit multiple uplink signals to one or more cells on multiple uplink carriers. For intra-band carrier aggregation, the transmissions are sent on different carriers in the same band. For inter-band carrier aggregation, the transmissions are sent on multiple carriers in different bands. Those skilled in the art will understand, however, that aspects described herein may be implemented in systems, devices, and/or architectures that do not support carrier aggregation.

A power amplifier 344 may include one or more stages having, for example, driver stages, power amplifier stages, or other components, that can be configured to amplify a communication signal on one or more frequencies, in one or more frequency bands, and at one or more power levels. The transistors configured to amplify the communication signal are generally selected to operate at substantially higher frequencies. Heterojunction bipolar transistors improve upon bipolar transistors by supporting substantially higher frequencies (e.g., up to several hundred gigahertz (GHz)). Heterojunction bipolar transistors are, therefore, often used in high speed circuits, such as RF chip designs specifying high power efficiency including RF power amplifiers in mobile RF transceivers.

A high electron mobility transistor (HEMT) is a type of field effect transistor (FET) that relies on a junction between different semiconductor materials with different bandgaps to form a heterojunction, similar to a heterojunction bipolar transistor. A high electron mobility transistor may also use a III-V compound semiconductor material, a II-VI compound semiconductor material, or other like compound semiconductor material, which exhibits high carrier mobility and direct energy gaps. High electron mobility transistors improve upon heterojunction transistors by supporting substantially higher transmission frequencies, which may meet future 5G/5G+ performance specifications.

While heterojunction bipolar transistors and pseudomorphic high electron mobility transistors offer possible solutions to meeting future 5G/5G+ performance specifications, these transistors suffer from gate scaling issues and/or gate alignment issues noted above. For example, conventional compound semiconductor (e.g., GaAs, InP, and GaN) high electron mobility transistors are generally fabricated without self-aligned gates. The lack of self-aligned gates may be due to space limitations with regards to conventional processing steps. In addition, compound semiconductor heterojunction bipolar transistors that meet future 5G/5G+ performance specifications rely on compound semiconductor materials that are at least five times more expensive than conventional compound semiconductor materials. Therefore, a desire exists for a device and process that scales a gate length (Lgate) and provides for self-aligned gates to overcome the challenges described above.

Aspects of the present disclosure are directed to an innovative compound semiconductor FET having a gate (e.g., an asymmetric T-gate or a gamma gate) fabricated with a reduced gate length (Lgate). The reduced gate length Lgate may be reduced to a predetermined range (e.g., ~10 nanometers to ~0.1 microns), without using either an electron-beam or immersion lithography. Such a device and method enables a low cost compound semiconductor FET (e.g., a gallium arsenide (GaAs) pseudomorphic high electron mobility transistor (pHEMT)) device for 5G wireless communications. The compound semiconductor FET may include any gate having a base portion through an oxide layer and a head portion on the oxide layer. The head portion of the gate may be an asymmetric T-gate, a gamma gate, or other like asymmetric or symmetric gate configuration.

FIG. 4 illustrates a compound semiconductor field effect transistor (FET) 400 having a scaled gate length according to aspects of the present disclosure. In this arrangement, the compound semiconductor FET 400 is shown in a scaled Schottky gate configuration. Representatively, the compound semiconductor FET 400 includes a compound semiconductor substrate 402 (e.g., semi-insulating) that may be composed of a silicon gallium arsenide (Si GaAs). A buffer layer 404 is on the compound semiconductor substrate 402. The buffer layer 404, which may be composed of gallium arsenide (GaAs), is grown on the compound semiconductor substrate 402 to isolate defects from the compound semiconductor substrate 402. The buffer layer 404 provides a smooth surface on which to grow the active layers of the compound semiconductor FET 400.

The compound semiconductor FET 400 also includes a channel 406, which is generally grown after the buffer layer 404 and may be composed of aluminum gallium arsenide (AlGaAs), indium gallium arsenide (InGaAs), or other like compound semiconductor material. Ideally, all electron conduction of the compound semiconductor FET 400 should take place in the channel 406. Additional details regarding formation of the channel 406 and buffer layer 404 are omitted to avoid obscuring innovative details of the present disclosure. In aspects of the present disclosure, the compound semiconductor FET 400 includes a gate 470 having a vertical base portion 472 that extends through a hard mask 414, a first oxide layer 440, a passivation layer 412, and an etch stop layer 408 to the channel 406. A semiconductor portion of a source/drain region of the compound semiconductor FET 400 may be self-aligned with the vertical base portion 472 of the gate 470. The gate 470 may be an asymmetric T-gate, a symmetric T-gate, or a gamma gate.

The compound semiconductor FET 400 includes a head portion 474 on the first oxide layer 440. The head portion 474 of the gate 470 may be an asymmetric T-gate, a gamma gate, or other like asymmetric or symmetric gate configuration. The compound semiconductor FET 400 includes source/drain regions composed of a doped compound semiconductor layer 410 (e.g., N+ GaAs) and ohmic contacts 430 (e.g., gold germanium (AuGe)) covered by the passivation layer 412. In FIG. 4, dual transistors are shown, separated by an isolation layer 420. In addition, source/drain (S/D) contacts and gate contacts (GC) to the source/drains and gates of the compound semiconductor FET 400 are also shown. A reduced gate length (Lgate) process is shown in FIGS. 5A-5V for fabricating the compound semiconductor FET 400 as a Schottky gate compound semiconductor FET, for example, as shown in FIG. 4.

FIG. 5A illustrates a portion of the compound semiconductor FET 400 after step 501 of a reduced gate length process 500 according to aspects of the present disclosure. FIG. 5A shows the compound semiconductor substrate 402 supporting the buffer layer 404 and the channel 406 (e.g., a channel layer), which are epitaxially grown. The etch stop layer 408 (e.g., aluminum arsenide (AlAs)) is shown on the channel 406, supporting the doped compound semiconductor layer 410.

Figure 5B:
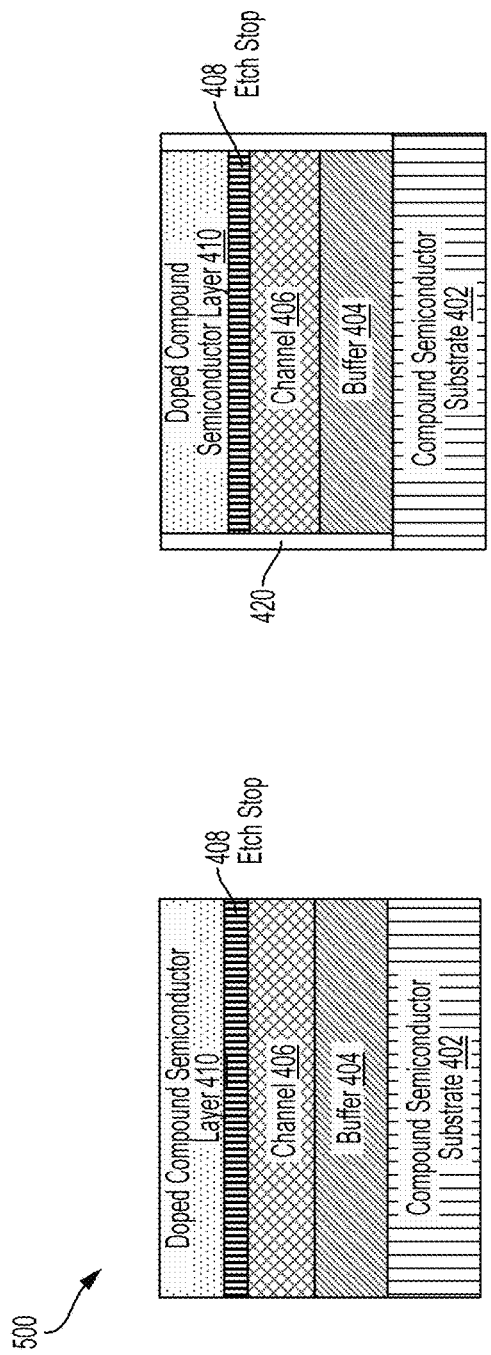

FIG. 5B illustrates a portion of the compound semiconductor FET 400 after step 502 of the reduced gate length process 500 to form the isolation layer 420 according to aspects of the present disclosure. The isolation layer 420 may be formed by an isolation and implanting process using, for example, a helium implant dose (e.g., 1E14-1E15 cm-2). Following the helium implant, an annealing process (e.g., at 500° C. for approximately one minute) forms the isolation layer 420.

Figure 5C:
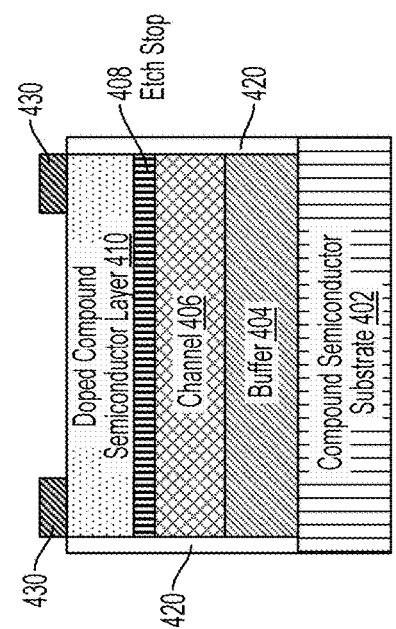
Figure 5E:
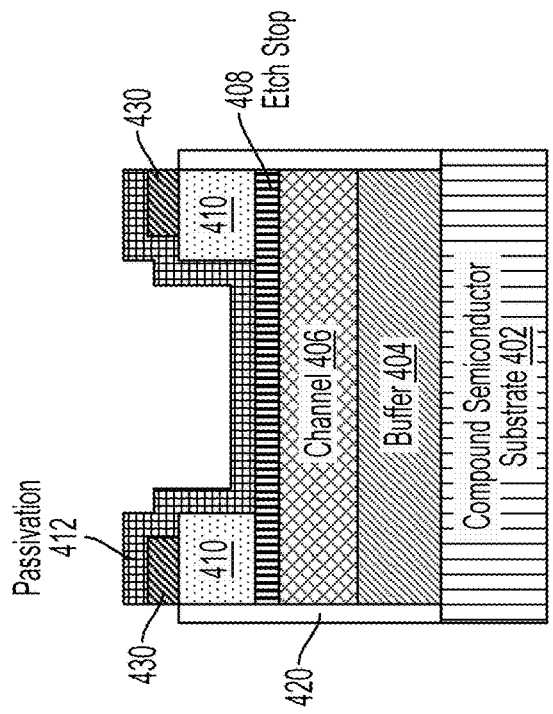

FIG. 5C illustrates a portion of the compound semiconductor FET 400 after step 503 of the reduced gate length process 500 to form the ohmic contacts 430 according to aspects of the present disclosure. The ohmic contacts 430 may be formed using a contact lithography deposition on the doped compound semiconductor layer 410. A lift-off and ohmic anneal process (e.g., at 425° C. for approximately one minute) forms the ohmic contacts 430. The ohmic contacts 430 form a portion of the source/drain regions of the compound semiconductor FET 400.

Figure 5D:
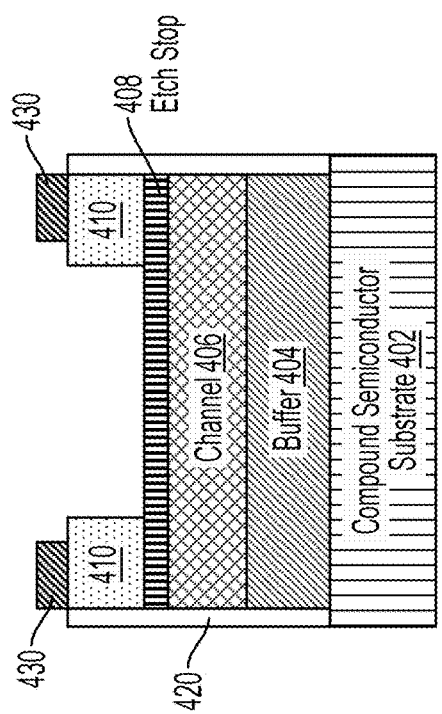
Figure 5G:
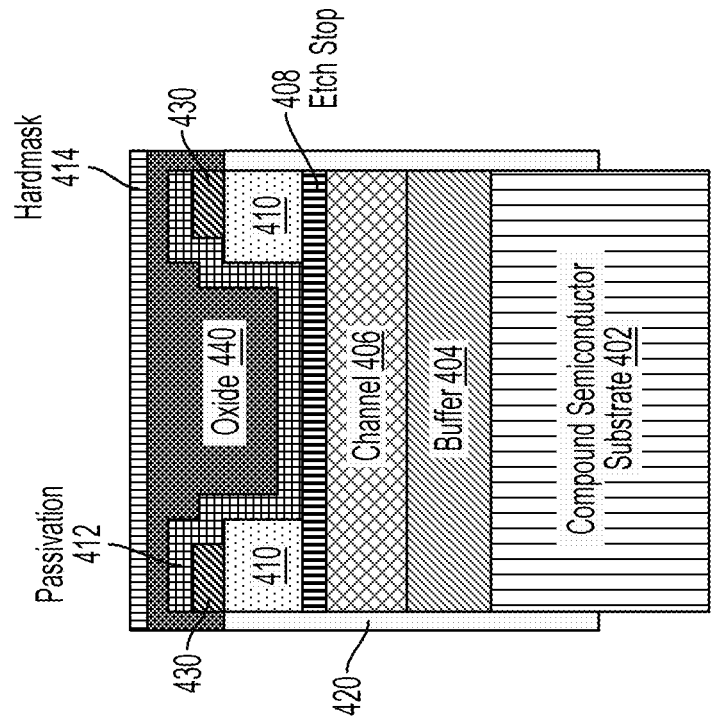

FIG. 5D illustrates a portion of the compound semiconductor FET 400 after step 504 of the reduced gate length process 500 to form source/drain regions according to aspects of the present disclosure. For example, a recess etch process is performed on the doped compound semiconductor layer 410 that stops on the etch stop layer 408. The ohmic contacts 430 may provide a mask, such that remaining portions of the doped compound semiconductor layer 410 support the ohmic contacts 430. The etch process may be a wet chemical etch that stops on and exposes the etch stop layer 408.

FIG. 5E illustrates a portion of the compound semiconductor FET 400 after step 505 of the reduced gate length process 500 to form the passivation layer 412 according to aspects of the present disclosure. The passivation layer 412 is formed on an exposed surface of the etch stop layer 408. The passivation layer 412 is also formed on sidewalls of the remaining portions of the doped compound semiconductor layer 410 as well as sidewalls and an exposed surface (e.g., facing away from the doped compound semiconductor layer 410) of the ohmic contacts 430. The passivation layer 412 may be formed by an atomic layer deposition (ALD) process. The ALD process may form the passivation layer 412 as a layer of aluminum oxide ($Al_2O_3$) having a predetermined thickness (e.g., 2-5 nanometers).

Figure 5F:
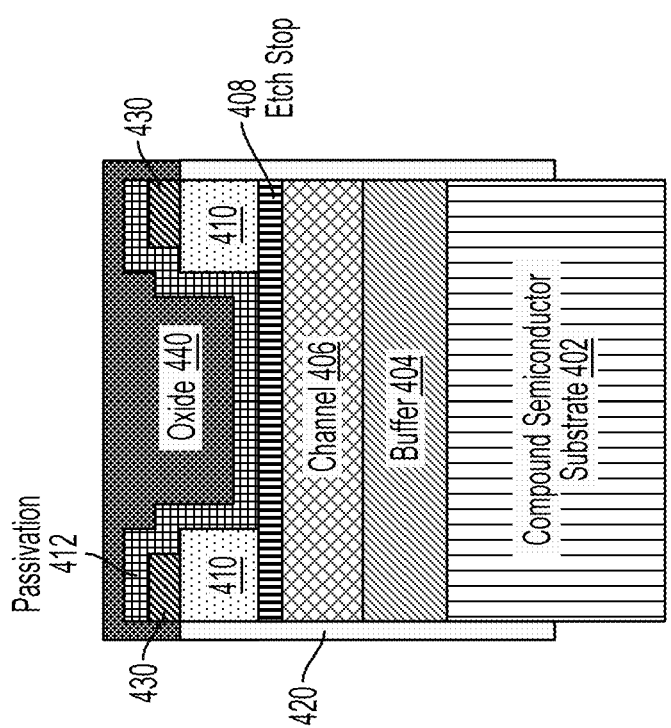

FIG. 5F illustrates a portion of the compound semiconductor FET 400 after step 506 of the reduced gate length process 500 to form a first dielectric layer according to aspects of the present disclosure. The first dielectric layer may be the first oxide layer 440 formed using a spin-on oxide planarization and coating process. This process may coat the passivation layer 412 with a spin-on oxide that is liquid at room temperature (e.g., a liquid oxide layer). The spin-on oxide may be subjected to a bake process (e.g., at 400° C. for approximately 10 minutes) to form the first oxide layer 440 as a solid oxide layer. The first oxide layer 440 is formed on the passivation layer 412 and contacts exposed sidewalls of the ohmic contacts 430 as well as a portion of the isolation layer 420.

FIG. 5G illustrates a portion of the compound semiconductor FET 400 after step 507 of the reduced gate length process 500 to form the hard mask 414 according to aspects of the present disclosure. The hard mask 414 may be composed of silicon nitride (SiN) or other like protective layer. The hard mask 414 may be formed by using a plasma enhanced, chemical vapor deposition (PECVD) process. The PECVD process is performed on the first oxide layer 440 to form the hard mask 414 as a silicon nitride layer having a predetermined thickness (e.g., approximately 10 nanometers). According to aspects of the present disclosure, the hard mask 414 provides a mask layer for forming a base portion of, for example, a scaled T-gate using, for example, a pattern transfer process, as is further described.

Figure 5H:
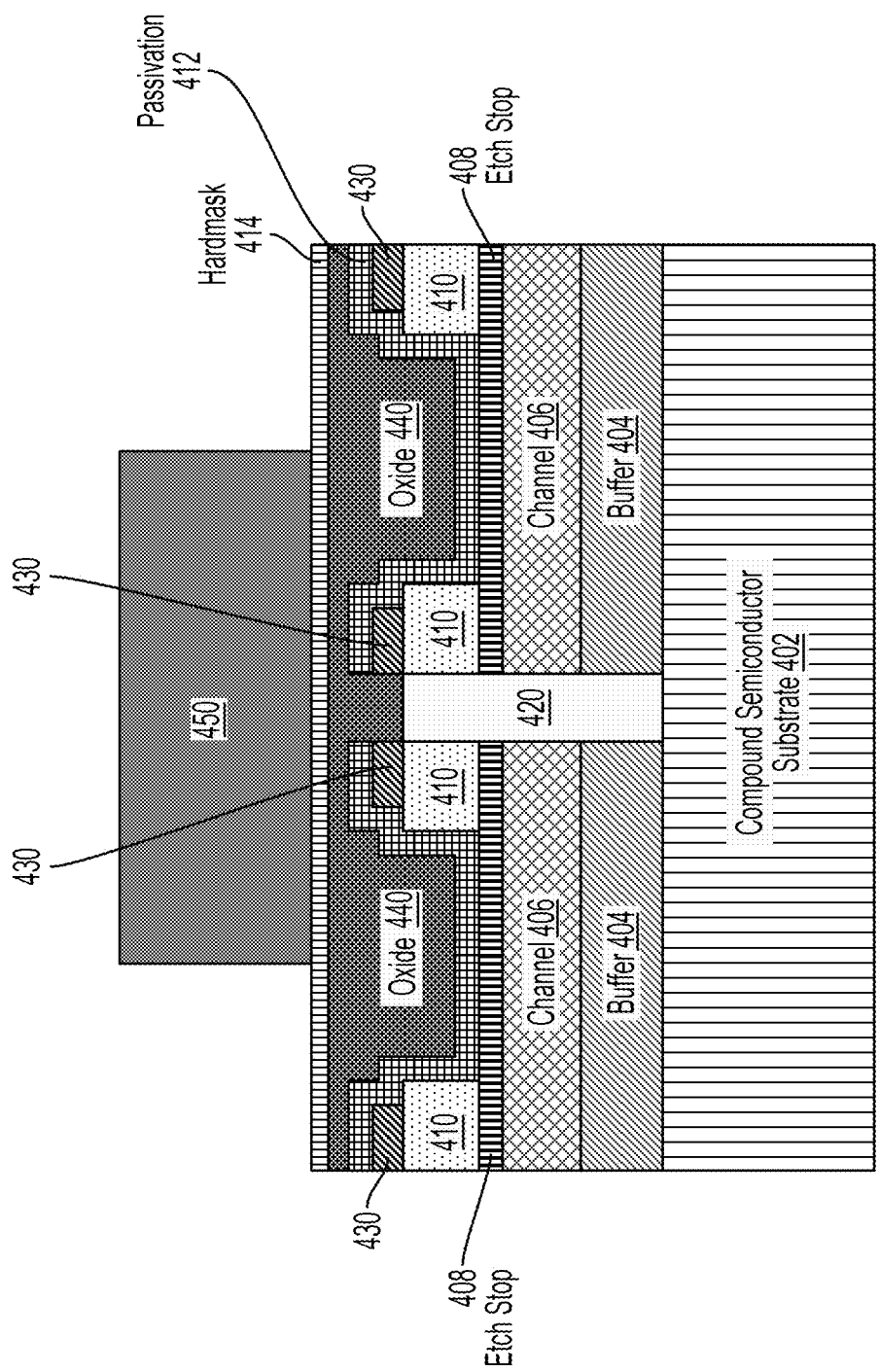

FIG. 5H illustrates a portion of the compound semiconductor FET 400 after step 508 of the reduced gate length process 500 to form a gate pattern 450 according to aspects of the present disclosure. A thickness of the gate pattern 450 may determine the gate length Lgate of the compound semiconductor FET 400. The gate pattern 450 may be formed using a plasma enhanced chemical vapor deposition (PECVD) on the hard mask 414. The PECVD process may deposit a silicon germanium (SiGe) layer having a determined thickness (e.g., 25 nanometers to 0.5 microns). In addition, the silicon germanium layer may be substantially composed of germanium (e.g., germanium≥50%). Once formed, the silicon germanium layer is subjected to a dry etch to form the gate pattern 450 on the hard mask 414. The greater the thickness of the gate pattern 450, the longer the gate length Lgate.

Figure 5I:
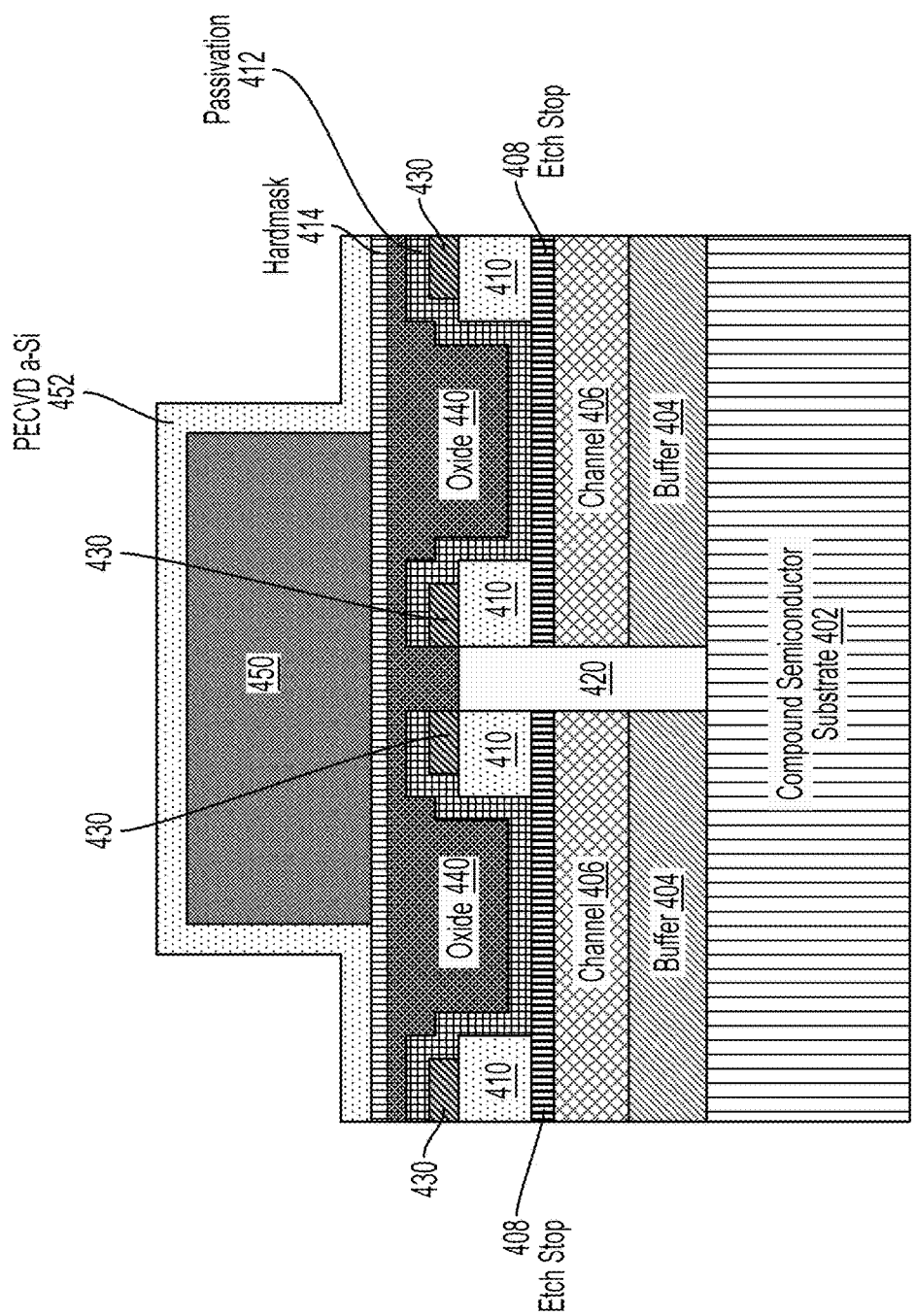

FIG. 5I illustrates a portion of the compound semiconductor FET 400 after step 509 of the reduced gate length process 500 to form a spacer material layer 452 according to aspects of the present disclosure. The spacer material layer 452 may also be formed using a plasma enhanced chemical vapor deposition (PECVD) process on the gate pattern 450 and on the hard mask 414. The spacer material layer 452 may be formed by depositing a conformal spacer material, such as amorphous silicon (a-Si) having a predetermined thickness (e.g., in the range of 5 nanometers to 0.15 microns).

Figure 5J:
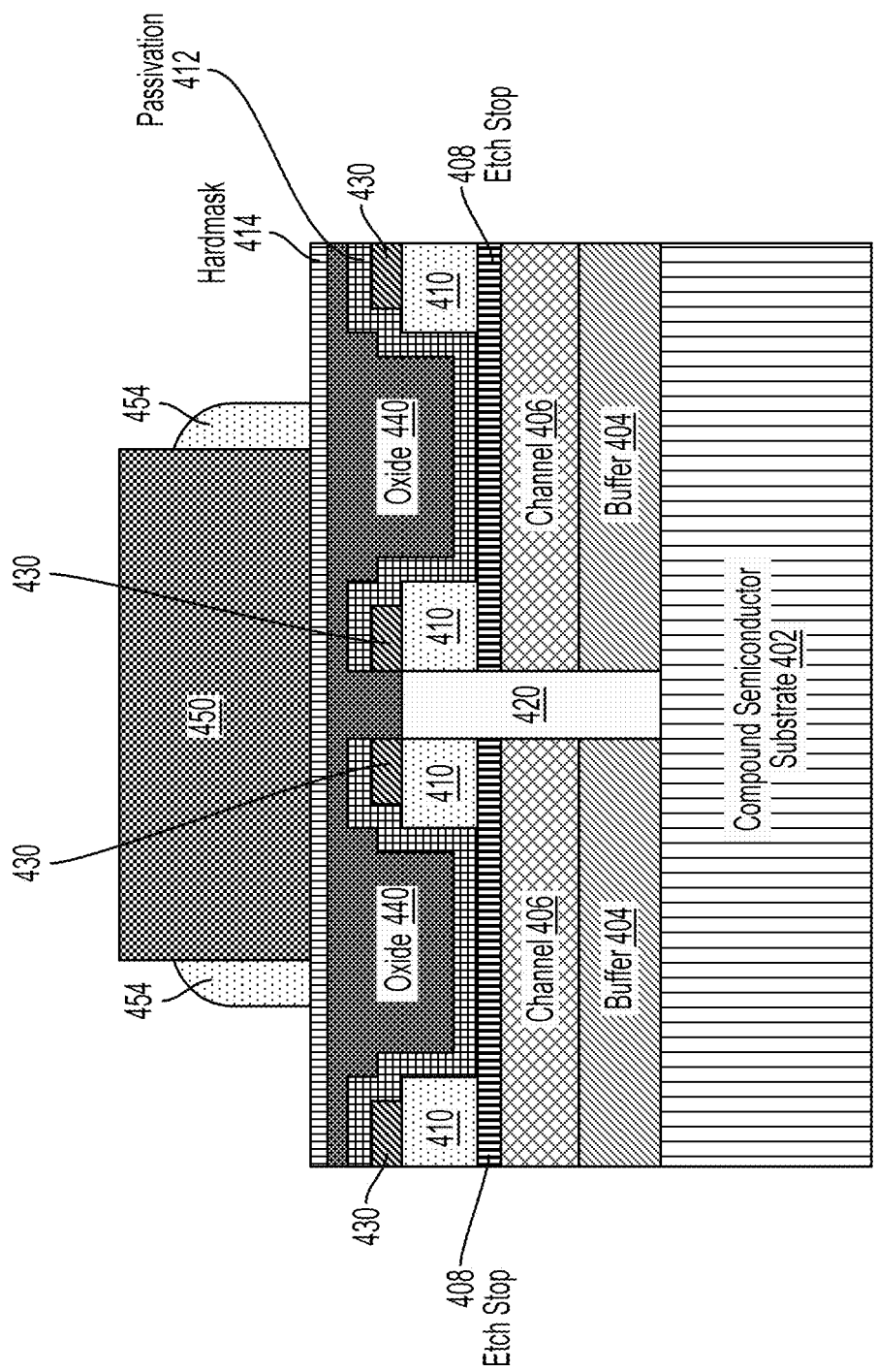

FIG. 5J illustrates a portion of the compound semiconductor FET 400 after step 510 of the reduced gate length process 500 to form spacers 454 according to aspects of the present disclosure. The spacers 454 may be formed by subjecting the spacer material layer 452 to a dry etch process. According to aspects of the present disclosure, a thickness of the spacers 454 is scalable, depending on the thickness of the spacer material layer 452. The thickness of the spacer material layer 452 may range from 100 nanometers to 5 micrometers. A final thickness of the spacers 454 may range from 1 nanometer to 0.25 micrometers. For a 0.25 micrometer spacer thickness, the spacers 454 may correspond to an eSiGe thickness of approximately 1.25 micrometers, with an amorphous silicon (a-Si) thickness of approximately 0.5 micrometers. For a 1 micrometer spacer thickness, the spacers 454 may correspond to an eSiGe thickness of approximately 10 micrometers, with an amorphous silicon (a-Si) thickness of approximately 2 micrometers.

Figure 5K:
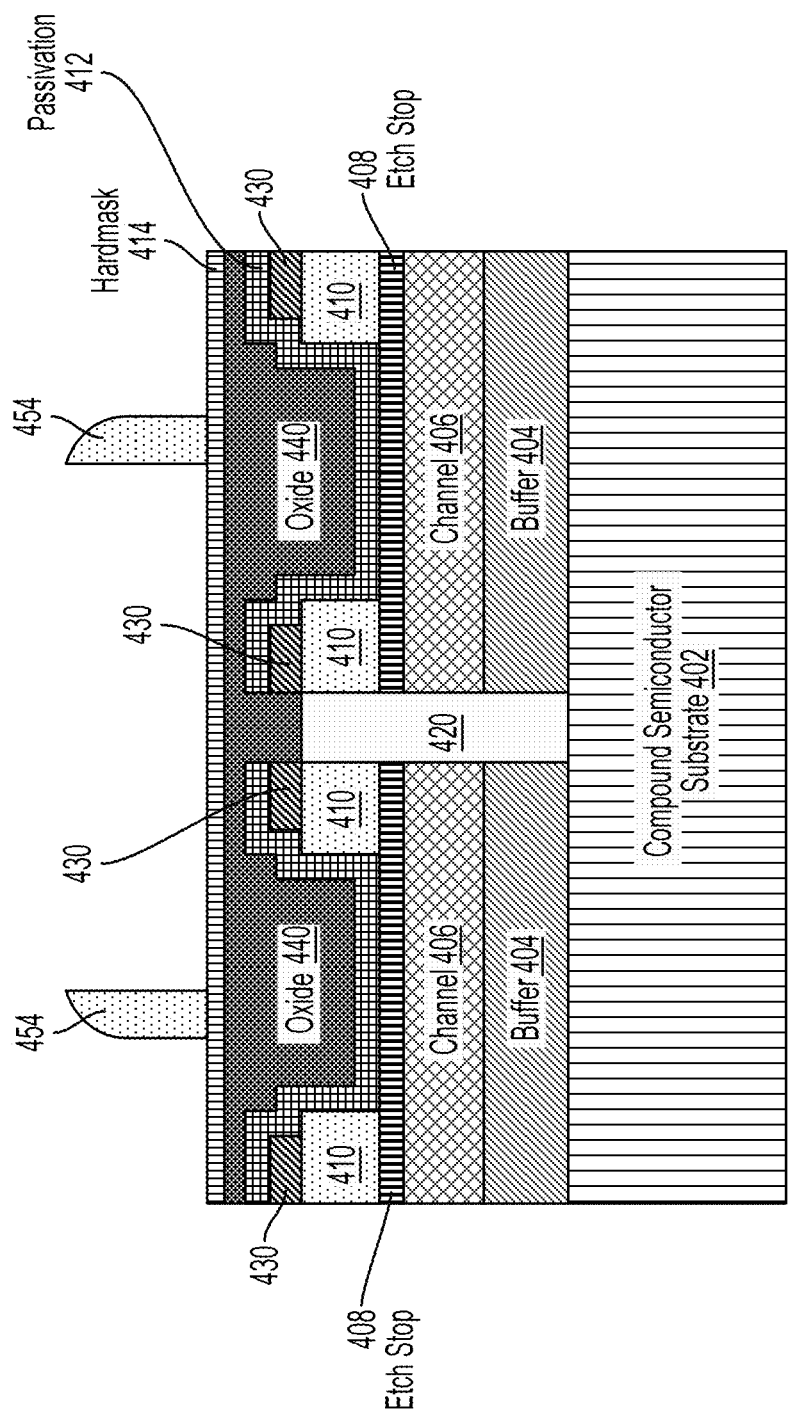

FIG. 5K illustrates a portion of the compound semiconductor FET 400 after step 511 of the reduced gate length process 500 to complete formation of spacers 454 according to aspects of the present disclosure. The spacers 454 are completed by subjecting the gate pattern 450 to a selective etch, such that the gate pattern 450 is removed and the spacers 454 remain on the hard mask 414. The gate pattern 450 may be removed with a hydrochloric (HCL) wet etch to complete formation of the spacers 454 on the hard mask 414.

Figure 5L:
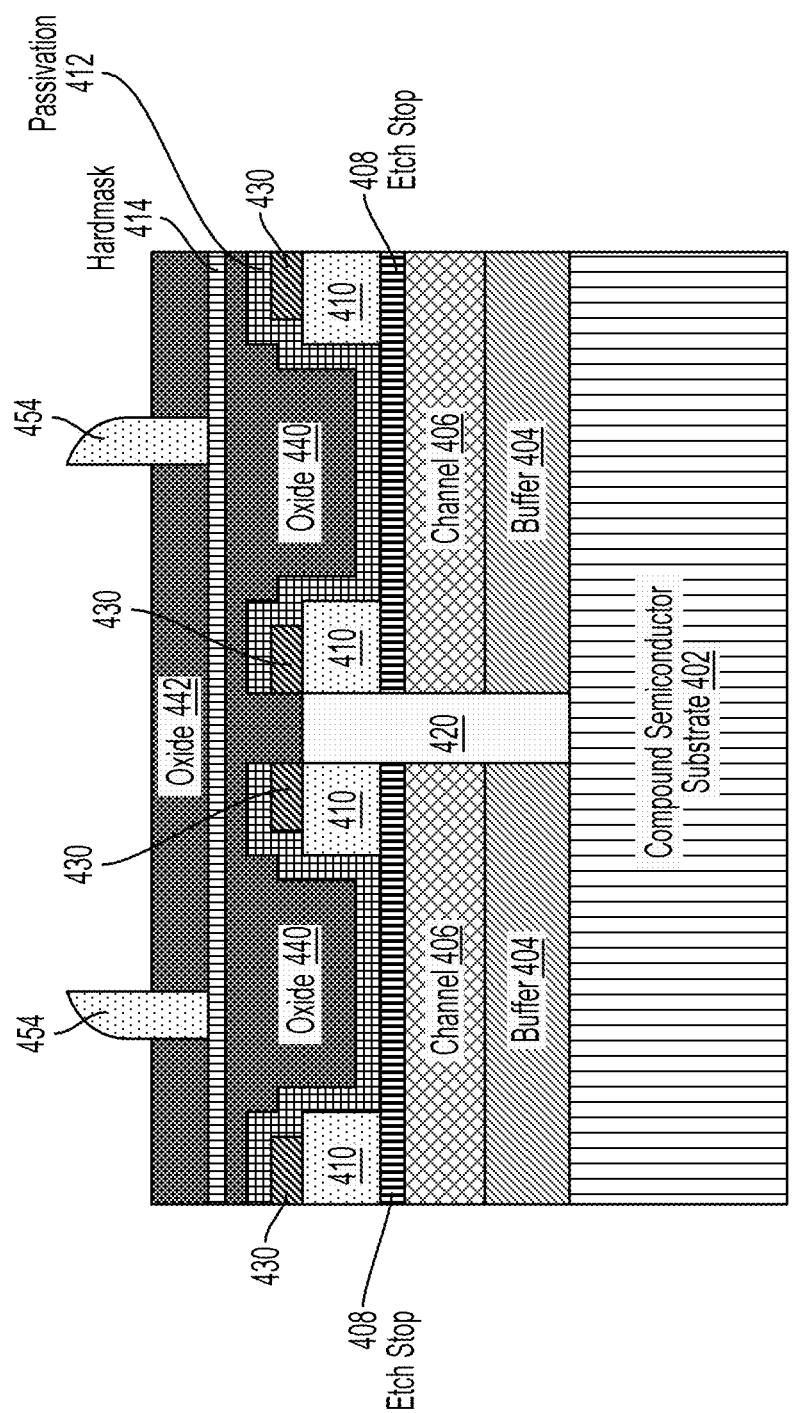

FIG. 5L illustrates a portion of the compound semiconductor FET 400 after step 512 of the reduced gate length process 500 to deposit a second dielectric layer according to aspects of the present disclosure. The second dielectric layer may be a second oxide layer 442 that is also formed using a spin-on oxide planarization and coating process. This process may coat the hard mask 414 and sidewalls of the spacers 454 with a spin-on oxide that is liquid at room temperature. The spin-on oxide may be subjected to a bake process (e.g., at 400° C. for approximately 10 minutes) to form the second oxide layer 442. The spacers 454 are partially exposed through the second oxide layer 442.

Figure 5M:
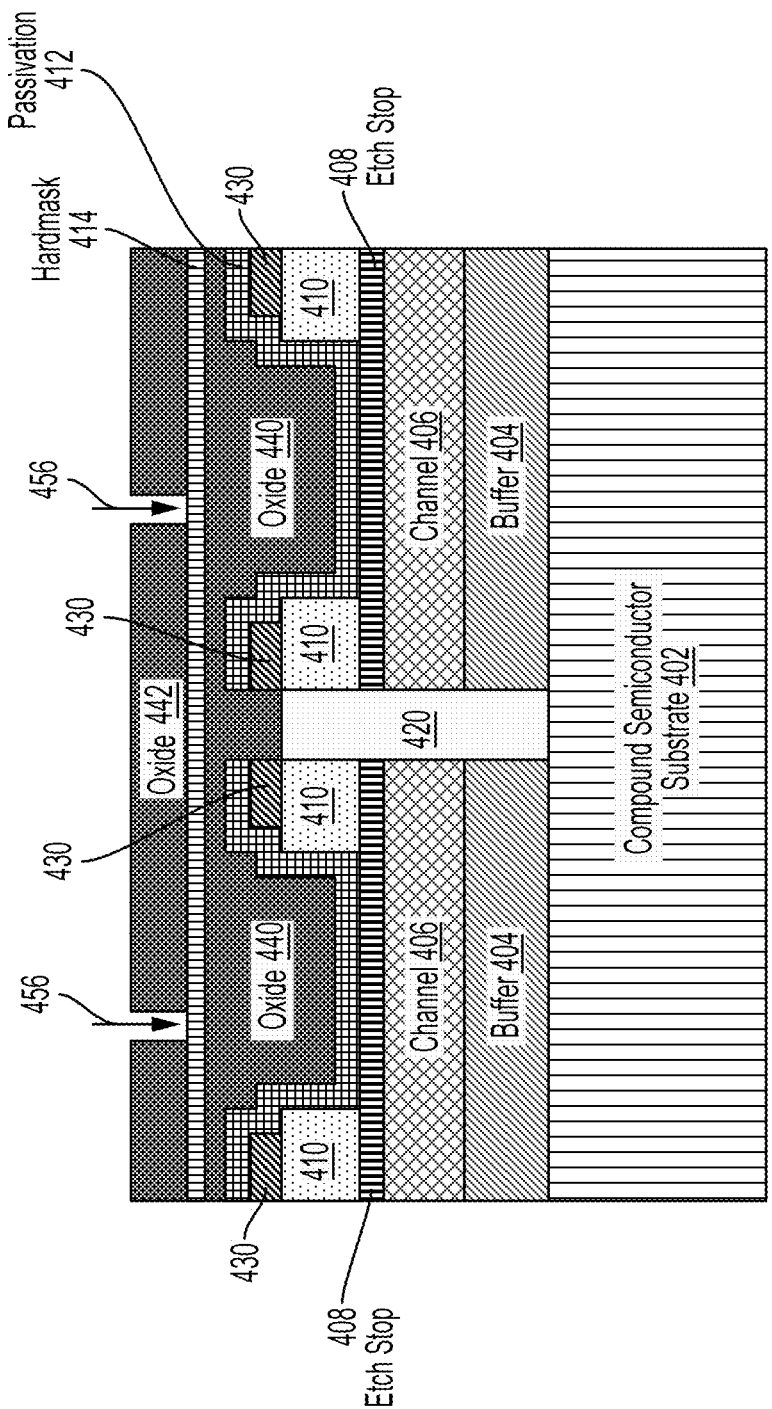

FIG. 5M illustrates a portion of the compound semiconductor FET 400 after step 513 of the reduced gate length process 500 to expose the hard mask 414 through the second dielectric layer according to aspects of the present disclosure. The hard mask 414 may be exposed through the second oxide layer 442 by subjecting the second oxide layer 442 to a selective etch. The selective etch may be a tetramethyl-ammonium hydroxide (TMAH) etch to form openings 456 in the second oxide layer 442.

Figure 5N:
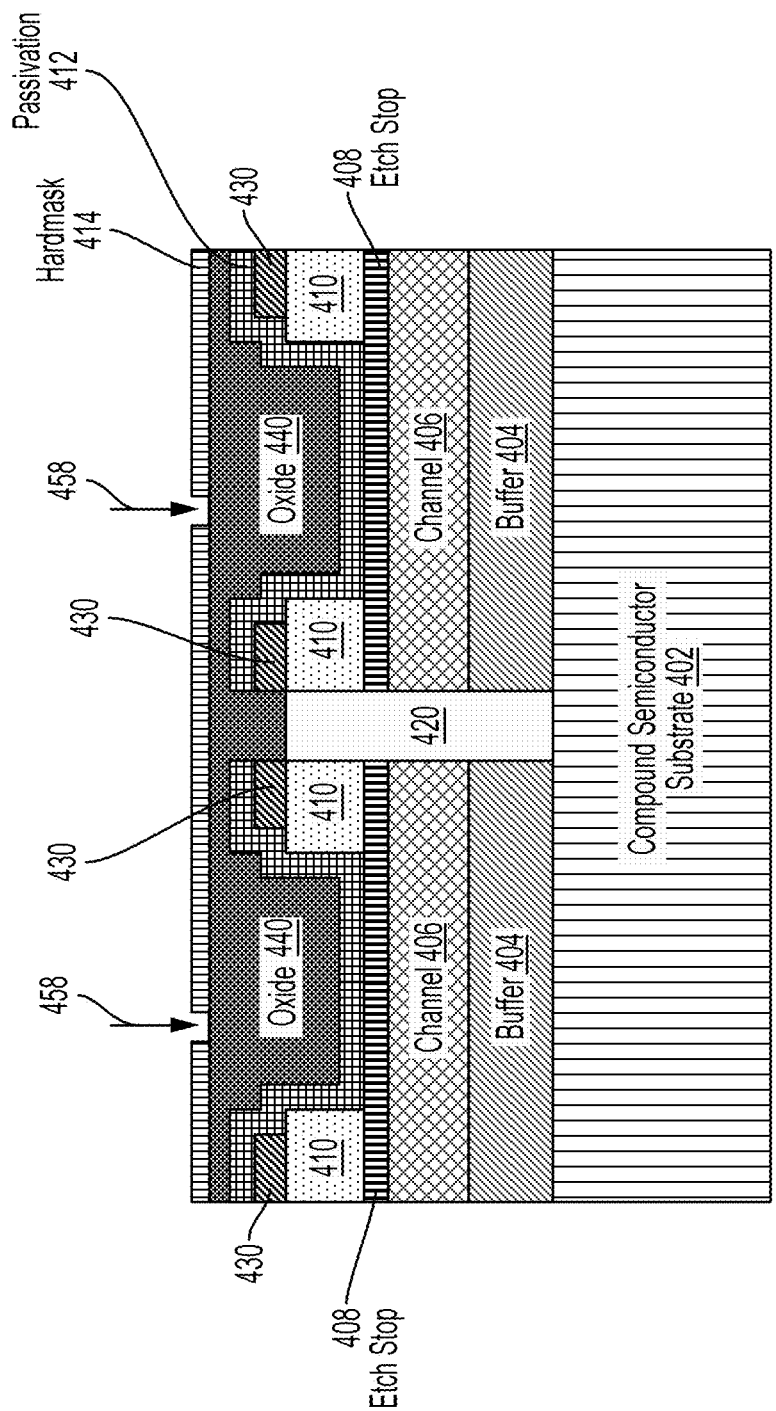
Figure 50:
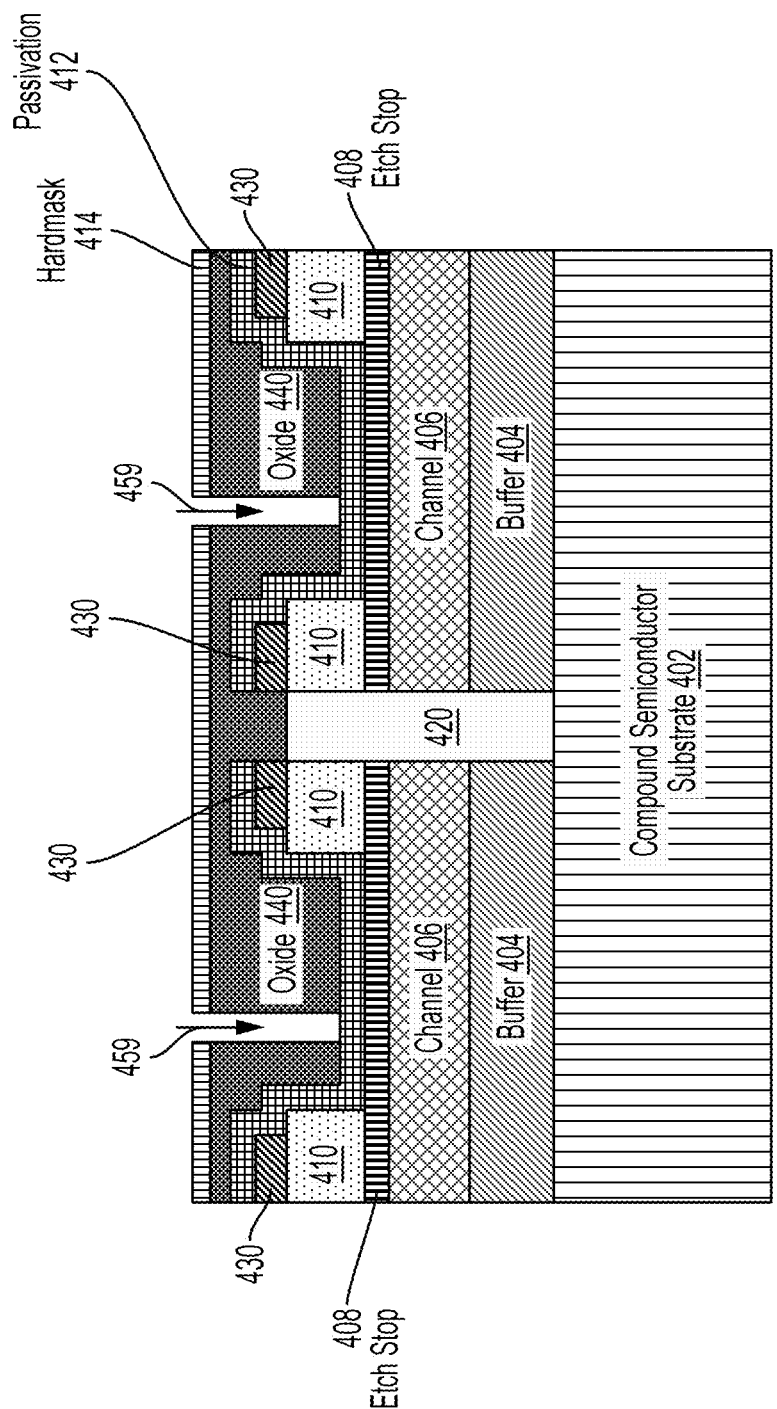
Figure 5P:
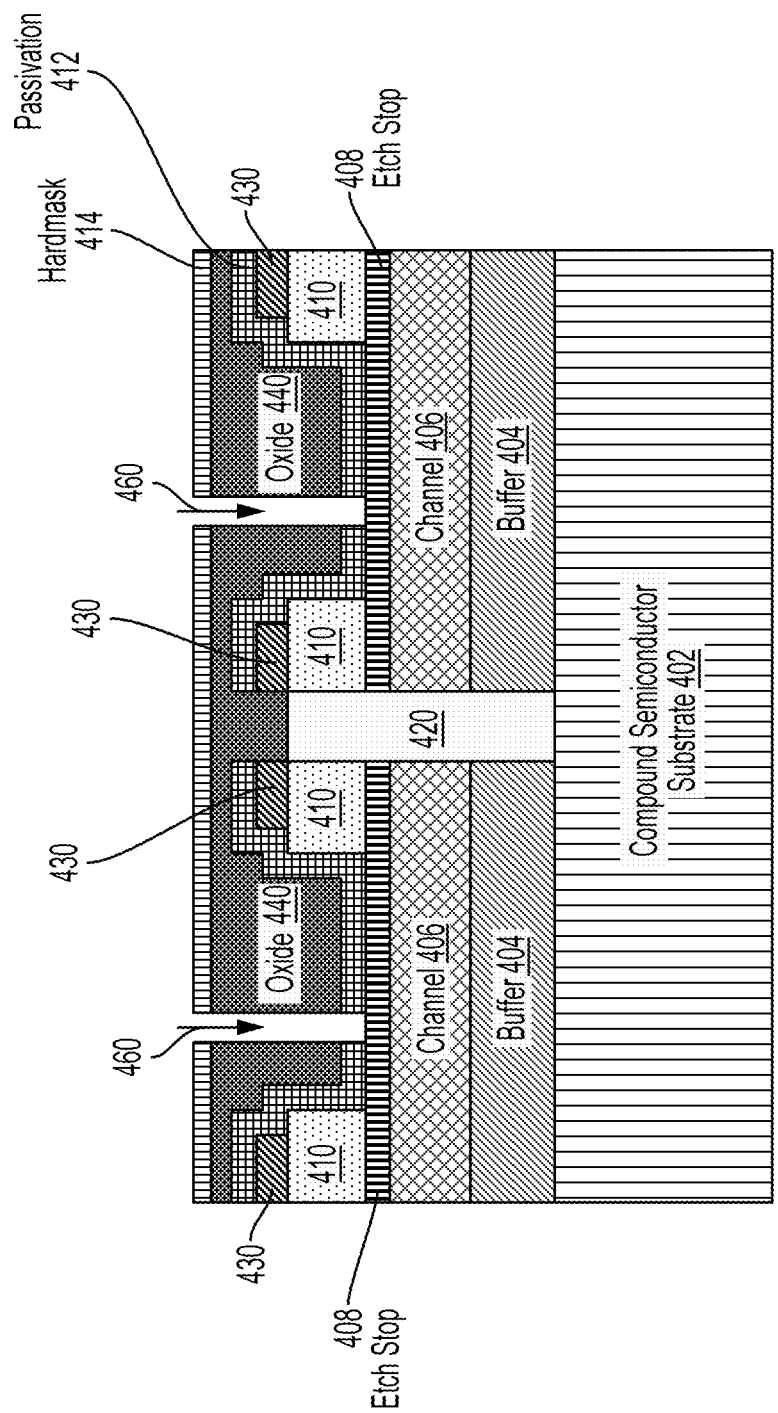

FIG. 5N illustrates a portion of the compound semiconductor FET 400 after step 514 of the reduced gate length process 500 to form openings in the hard mask 414 and remove the second dielectric layer according to aspects of the present disclosure. The hard mask 414 may be subjected to a selective dry etch to form openings 458 in the hard mask 414 exposing the first oxide layer 440. Once formed, the second oxide layer 442 is removed by etching the second oxide layer 442 and stopping on the hard mask 414.

FIG. 5O illustrates a portion of the compound semiconductor FET 400 after step 515 of the reduced gate length process 500 to form openings in the first oxide layer 440 stopping on the passivation layer 412 according to aspects of the present disclosure. The hard mask 414 may be used as a pattern for a selective dry etch of the first oxide layer 440 to form openings 459 in the first oxide layer 440, exposing the passivation layer 412. Once the openings 459 are formed, the reduced gate length process 500 may vary depending on whether a Schottky gate compound semiconductor FET or a compound semiconductor metal oxide semiconductor (MOSFET) is formed. A Schottky gate compound semiconductor FET of FIG. 4 is formed using steps 516a-523a of the reduced gate length Lgate process, and FIGS. 5P-5V. A compound semiconductor MOSFET of FIG. 6 is formed using steps 516b-523b of the reduced gate length Lgate process, as shown in FIG. 6 and FIGS. 7A-7G FIG. 5P illustrates a portion of the compound semiconductor FET 400 after step 516a of the reduced gate length process 500 to form openings 460 in the passivation layer 412 according to aspects of the present disclosure. The passivation layer 412 may be subjected to a selective dry etch to form openings 460 in the passivation layer 412 exposing the etch stop layer 408. Removal of the passivation layer 412, which is an oxide layer, prevents the formation of a metal oxide semiconductor FET (MOSFET) gate, as shown in FIG. 6. That is, removal of the passivation layer 412 enables formation of the Schottky gate compound semiconductor FET of FIG. 4.

Figure 5Q:
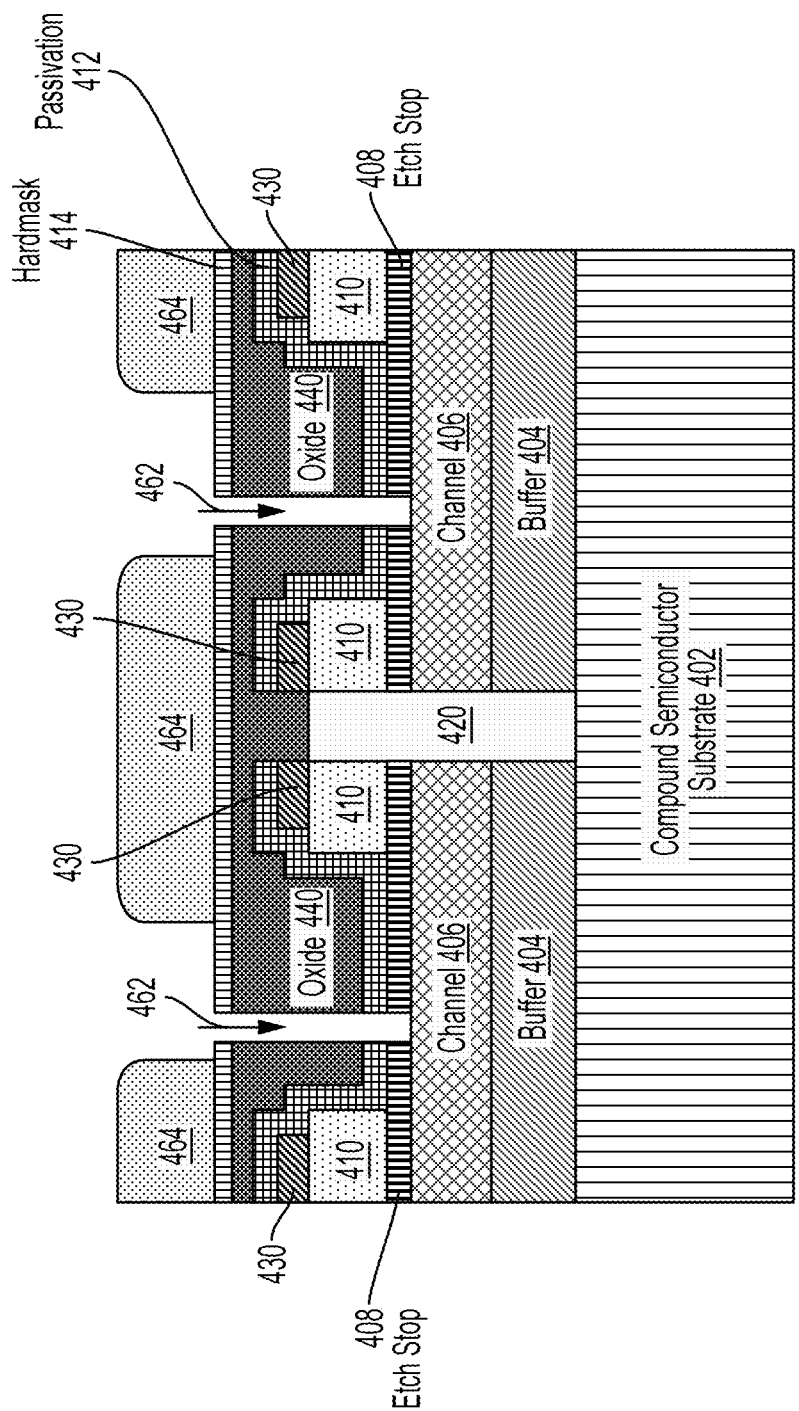

FIG. 5Q illustrates a portion of the compound semiconductor FET 400 after step 517a of the reduced gate length process 500 to form openings 462 in the etch stop layer 408 according to aspects of the present disclosure. The etch stop layer 408 may be subjected to a selective wet etch to form openings 462 in the etch stop layer 408 exposing the channel 406. Once formed, a first resist layer 464 is deposited and patterned on portions of the hard mask 414 according to a predetermined configuration of a Schottky T-gate according to aspects of the present disclosure.

Figure 5R:
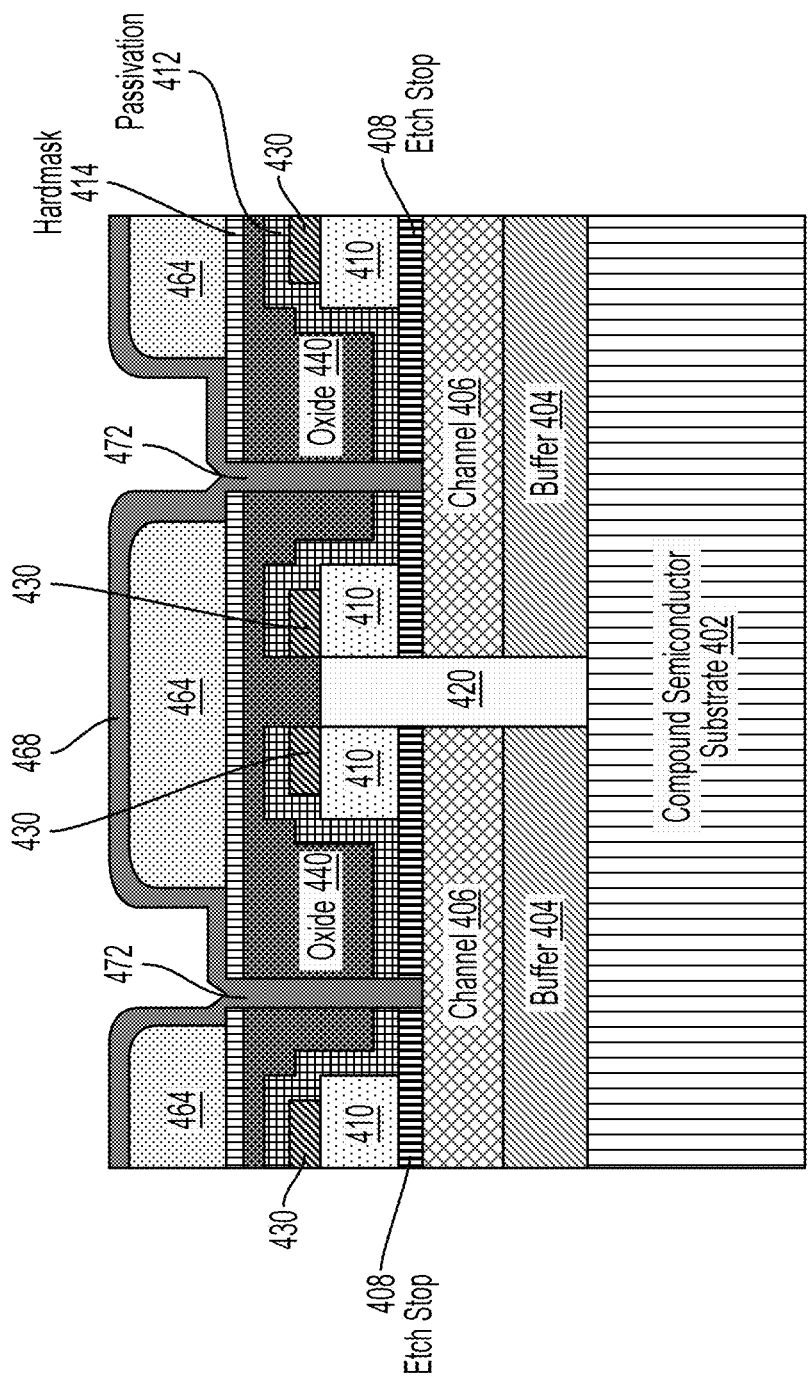

FIG. 5R illustrates a portion of the compound semiconductor FET 400 after step 518a of the reduced gate length process 500 to deposit a first gate material 468 of a Schottky T-gate according to aspects of the present disclosure. An atomic layer deposition (ALD) process may be performed to deposit the first gate material 468 in the openings 462, the hard mask 414, and the first resist layer 464. For example, the first gate material 468 may be sputtered to fill the openings 462 (FIG. 5Q). A portion of the first gate material 468 on the hard mask 414 and the first resist layer 464 may provide a seed layer for a second gate material. The first gate material 468 may be titanium nitride (TiN), tungsten silicon nitride (WSiN), or other like conductive gate material. Once filled in the openings 462 (FIG. 5Q), the first gate material 468 forms a vertical base portion 472 of, for example, a Schottky T-gate according to aspects of the present disclosure.

Figure 5S:
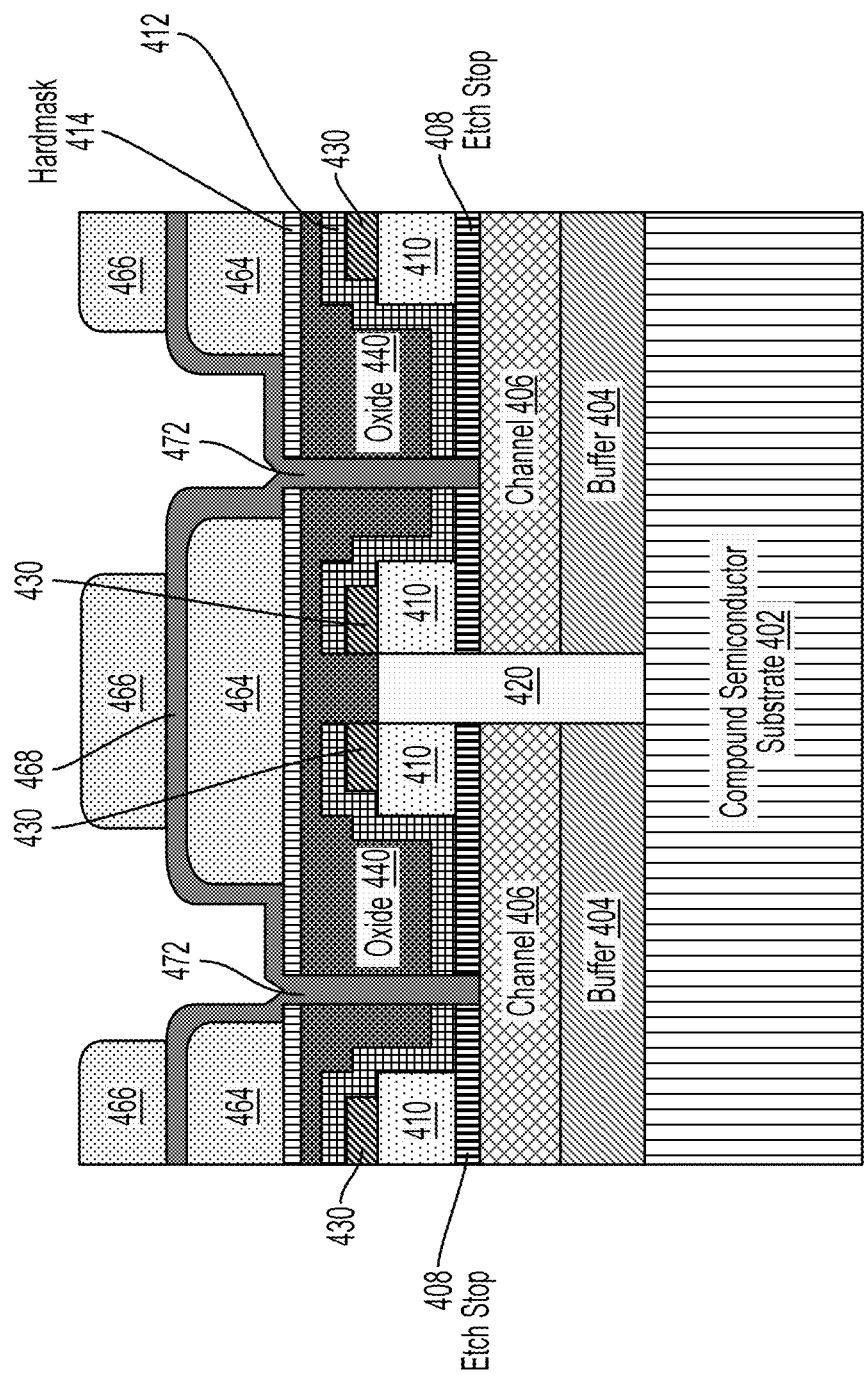

FIG. 5S illustrates a portion of the compound semiconductor FET 400 after step 519a of the reduced gate length process 500 to form a second resist layer 466 according to aspects of the present disclosure. The second resist layer 466 is deposited and patterned on portions of the first gate material 468 according to the predetermined configuration of a Schottky T-gate according to aspects of the present disclosure. In this case, the arrangement of the second resist layer 466 determines the shape of a head portion of the Schottky T-gate.

Figure 5T:
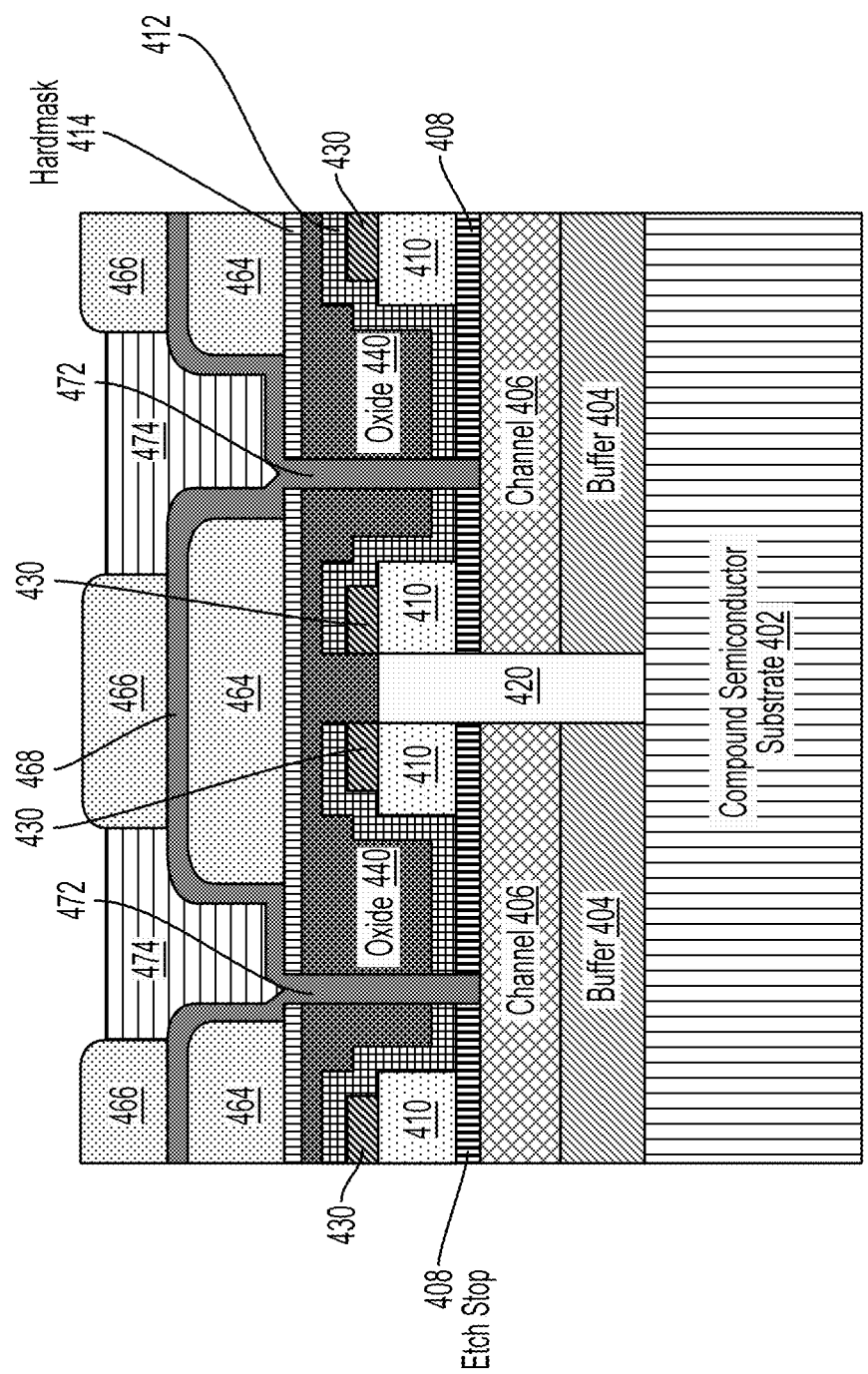

FIG. 5T illustrates a portion of the compound semiconductor FET 400 after step 520a of the reduced gate length process 500 to deposit a second gate material of a Schottky T-gate according to aspects of the present disclosure. A plating process may be performed to deposit the second gate material in the first gate material 468 and sidewalls of the second resist layer 466. The second gate material may be gold (Au), or other like conductive gate material, to enable formation of a head portion 474 of, for example, a Schottky T-gate according to aspects of the present disclosure.

Figure 5U:
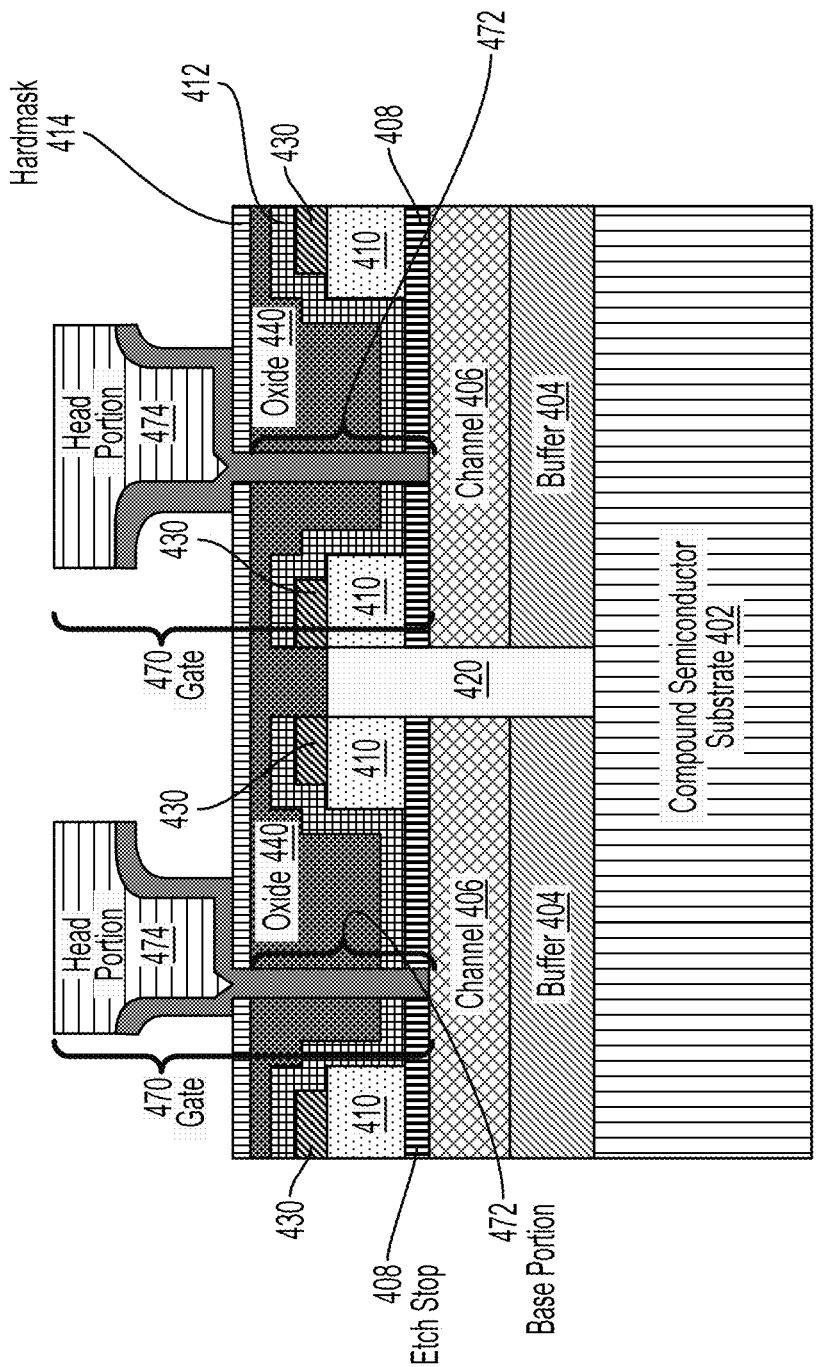

FIG. 5U illustrates a portion of the compound semiconductor FET 400 after step 521a of the reduced gate length process 500 to form Schottky T-gates according to aspects of the present disclosure. A stripping process may be performed to remove the first resist layer 464 and the second resist layer 466. In addition, an etch process is performed to remove portions of the first gate material 468, so that remaining portions of the first gate material 468 provide a seed layer for the head portion 474 of a gate 470. In this arrangement, the head portion 474 of the gate 470 is supported by the hard mask 414 and the first oxide layer 440. In addition, the vertical base portion 472 extends through the hard mask 414, the first oxide layer 440, the passivation layer 412, and the etch stop layer 408 to electrically contact the channel 406.

FIG. 5V illustrates a portion of the compound semiconductor FET 400 after step 522a of the reduced gate length process 500 to complete formation of the gate 470 as Schottky T-gates by depositing a dielectric layer 480 to cover the compound semiconductor FET 400 according to aspects of the present disclosure. The gate 470 may be an asymmetric T-gate including the vertical base portion 472 and the head portion 474. The configuration of the gate 470 may improve a breakdown voltage of the compound semiconductor FET 400, while reducing a source-gate resistance and improving a transmission frequency/maximum frequency (Ft/Fmax).

FIG. 6 illustrates a compound semiconductor field effect transistor (FET) including a metal oxide semiconductor field effect transistor (MOSFET) gate having a scaled gate length according to aspects of the present disclosure. In this arrangement, the compound semiconductor FET 600 is shown in a scaled MOSFET gate configuration. In contrast to the Schottky gate compound semiconductor FET of FIG. 4, the compound semiconductor FET 600 maintains the passivation layer 412, which is an oxide layer (e.g., $Al_2O_3$). The passivation layer enables formation of the MOSFET scaled gate, as shown in FIG. 6. A gate length scaling process 700 of forming the compound semiconductor FET 600 also includes steps 501-515, as shown in FIGS. 5A-5O. The gate length scaling process 700 continues at FIG. 7A.

Figure 7A:
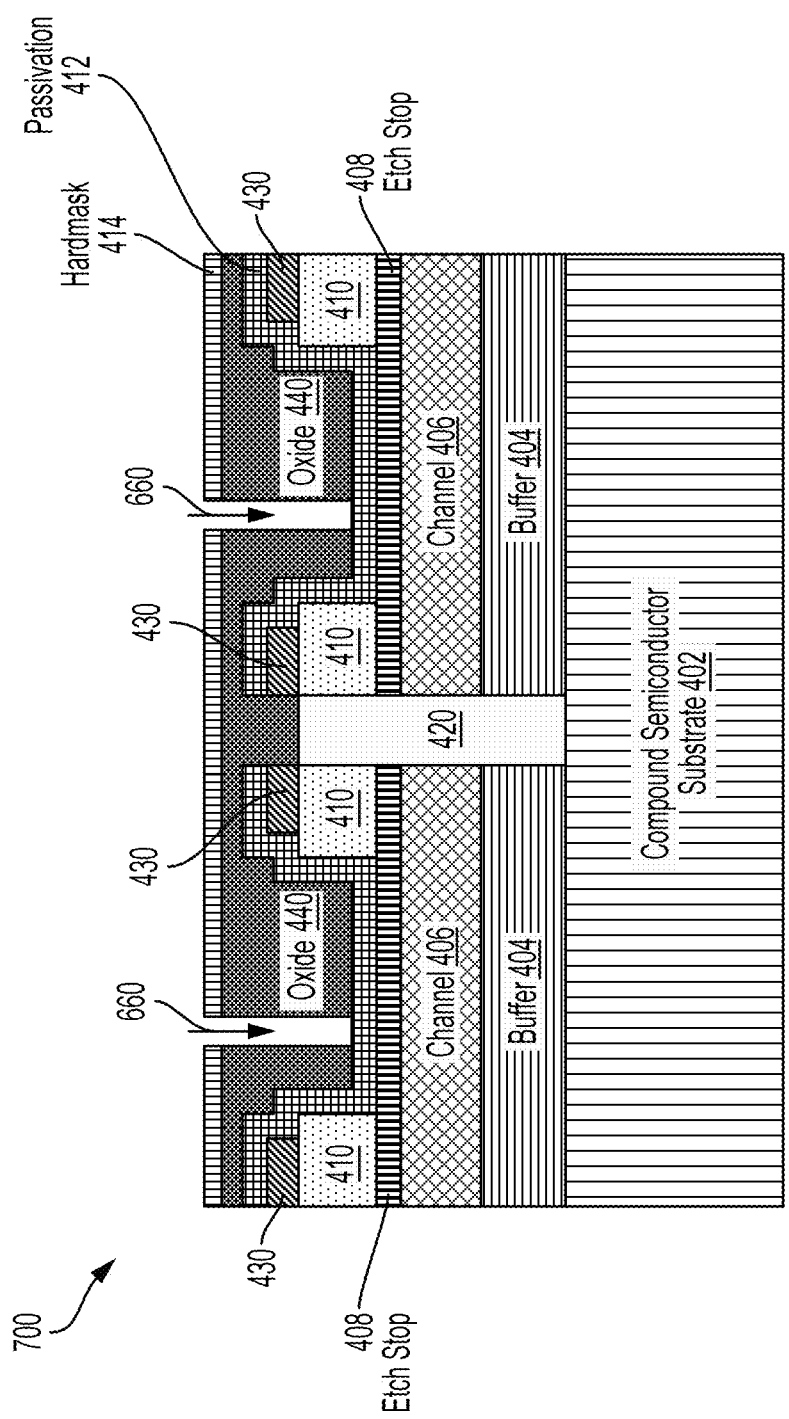
FIGS. 7A-7G illustrate formation of the compound semiconductor field effect transistor (FET) of FIG. 6 according to further aspects of the present disclosure.

FIG. 7A illustrates a portion of the compound semiconductor FET 600 after step 716b of the gate length scaling process 700 to form openings 660 in the first oxide layer 440 according to aspects of the present disclosure. In this arrangement, the passivation layer 412 is not etched to expose the etch stop layer 408. Removal of the passivation layer 412, which is an oxide layer, would prevent the formation of the MOSFET gate, as shown in FIG. 6. That is, removal of the passivation layer 412 enables formation of the Schottky gate compound semiconductor FET 400 of FIG. 4.

Figure 7B:
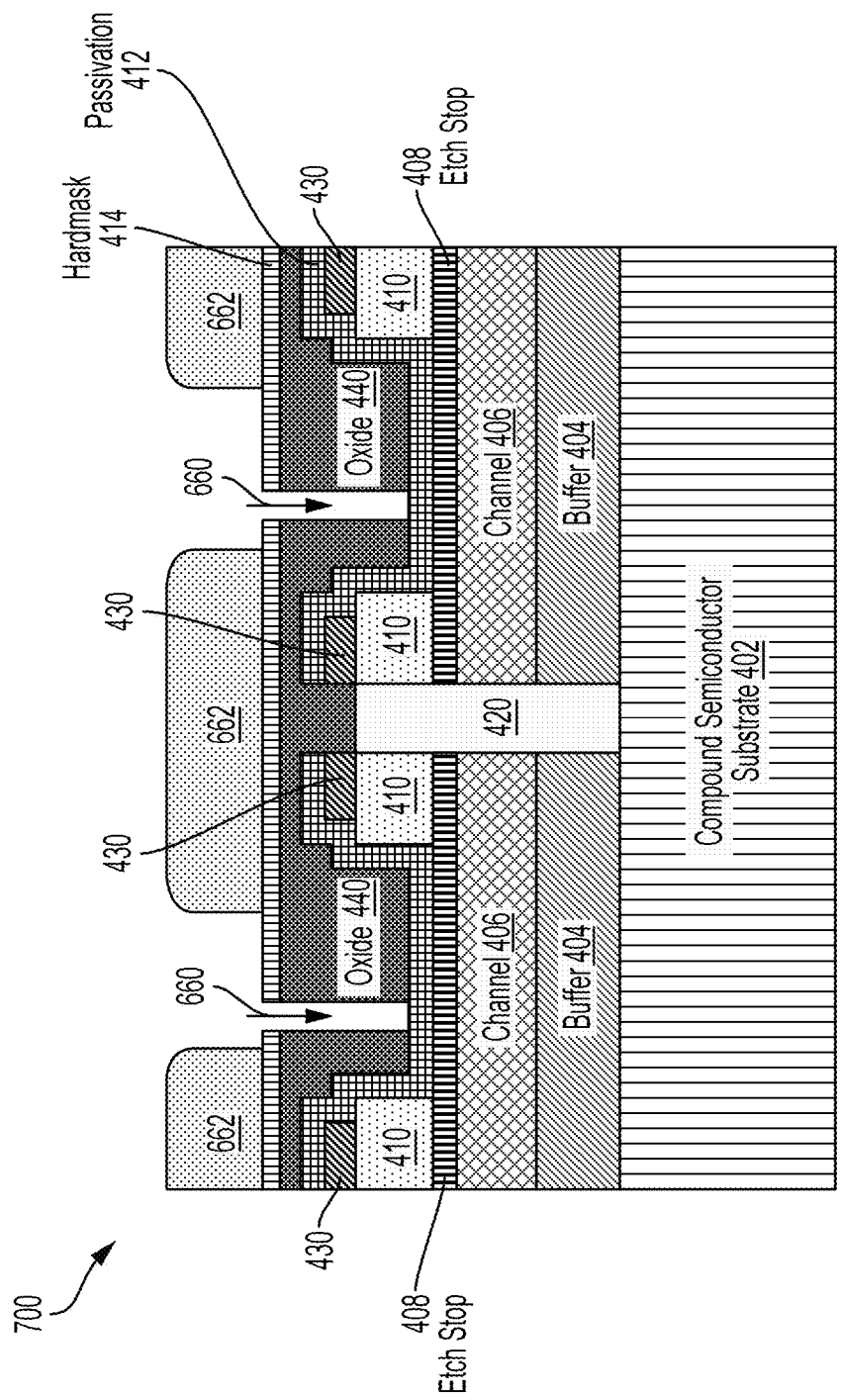

FIG. 7B illustrates a portion of the compound semiconductor FET 600 after step 717b of the reduced gate length process 700 to form a first resist layer 662 according to aspects of the present disclosure. In contrast to step 517a of the reduced gate length process 500, the etch stop layer 408 is maintained to avoid exposing the channel 406. The first resist layer 662 is deposited and patterned on portions of the hard mask 414 according to a predetermined configuration of a MOSFET T-gate according to aspects of the present disclosure.

Figure 7C:
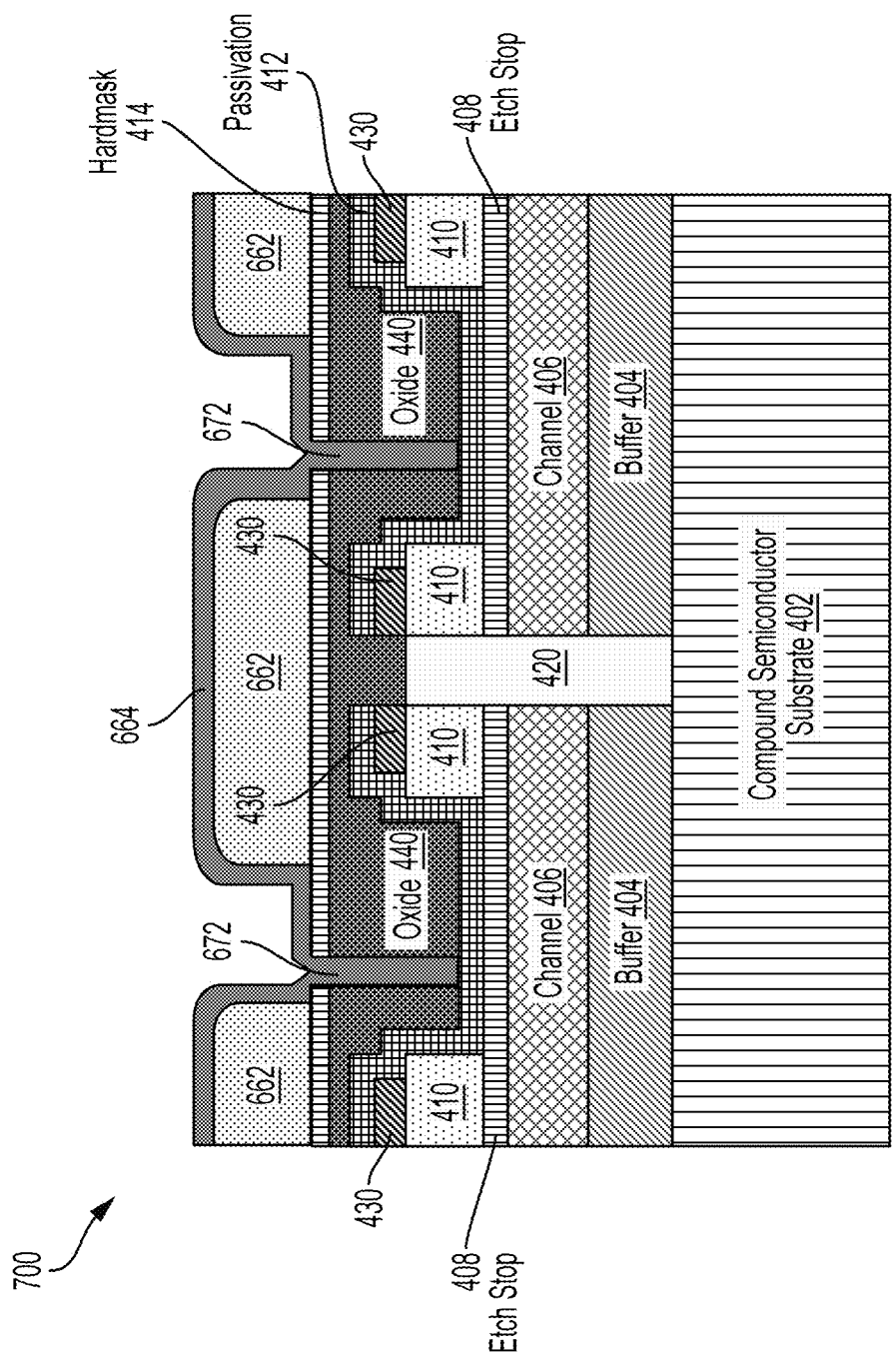

FIG. 7C illustrates a portion of the compound semiconductor FET 600 after step 718b of the gate length scaling process 700, in which a first gate material 664 of a MOSFET T-gate is deposited according to aspects of the present disclosure. An atomic layer deposition (ALD) process may be performed to deposit the first gate material 664 in the openings 660, on the hard mask 414, and on the first resist layer 662. A portion of the first gate material 664 on the hard mask 414 and the first resist layer 662 may provide a seed layer for a second gate material. The first gate material 664 may be titanium nitride (TiN), tungsten silicon nitride (WSiN), or other like conductive gate material. Once deposited in the openings 660, the first gate material 664 forms a base portion 672 (e.g., a vertical base portion) of, for example, a MOSFET T-gate according to aspects of the present disclosure.

Figure 7D:
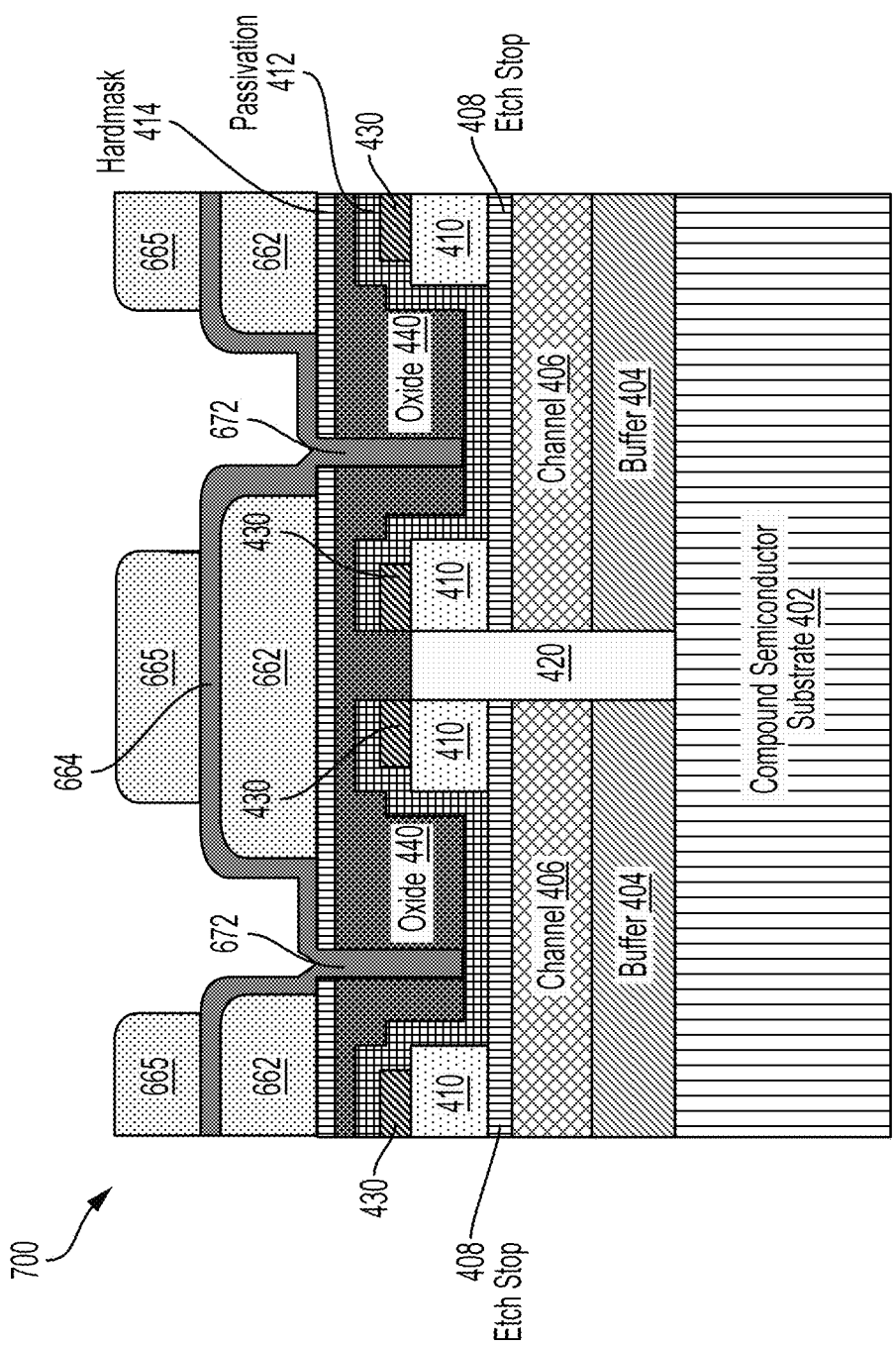

FIG. 7D illustrates a portion of the compound semiconductor FET 600 after step 719b of the gate length scaling process 700 to form a second resist layer 665 according to aspects of the present disclosure. The second resist layer 665 is deposited and patterned on portions of the first gate material 664 according to the predetermined configuration of a MOSFET T-gate according to aspects of the present disclosure. In this case, the arrangement of the second resist layer 665 determines the shape of a head portion of the MOSFET T-gate.

Figure 7E:
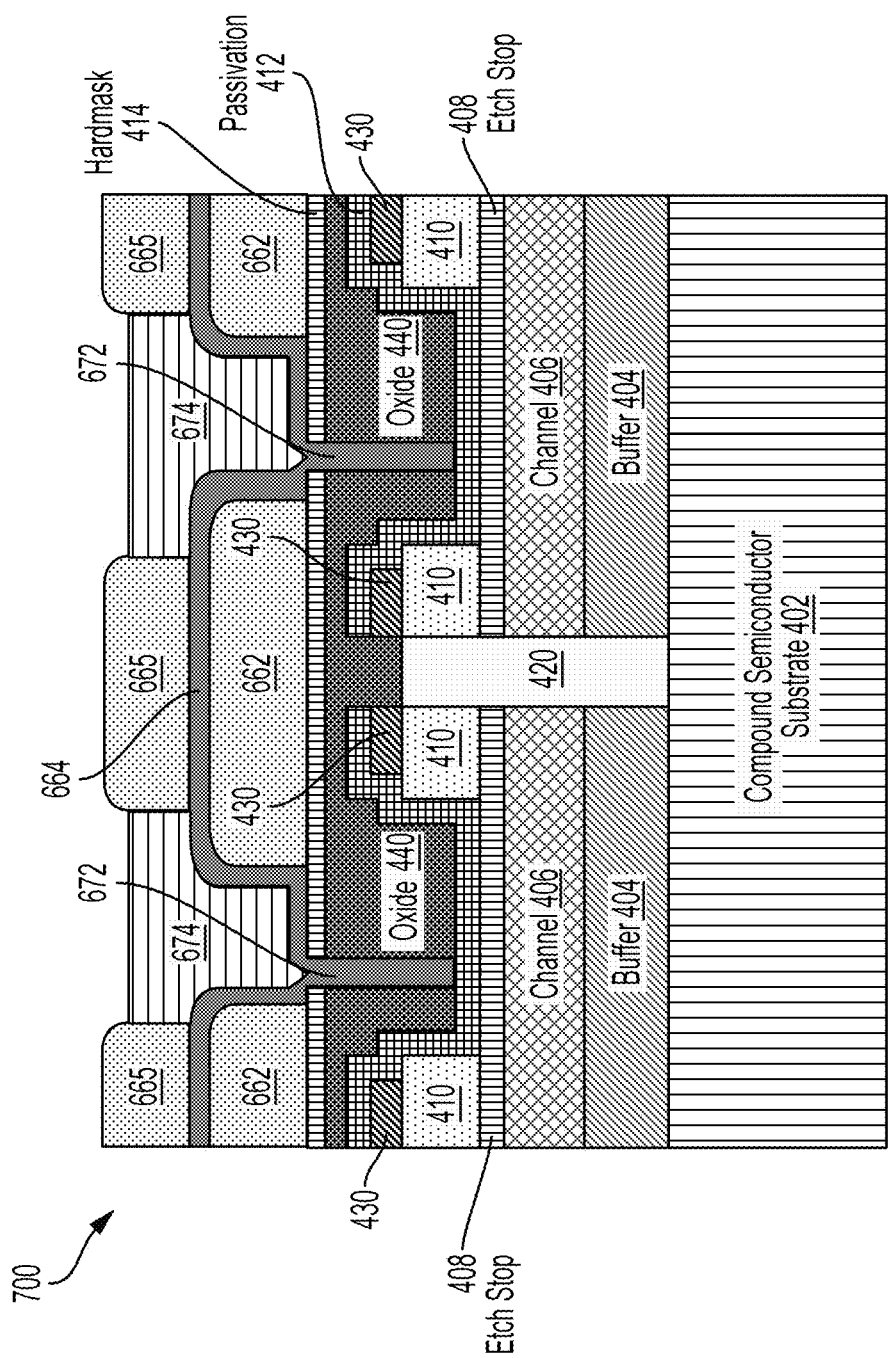

FIG. 7E illustrates a portion of the compound semiconductor FET 600 after step 720b of the gate length scaling process 700 to deposit a second gate material of a MOSFET T-gate according to aspects of the present disclosure. A plating process may be performed to deposit the second gate material on the first gate material 664 and sidewalls of the second resist layer 665. The second gate material may be gold (Au), or other like conductive gate material, to enable formation of a head portion 474 of, for example, a MOSFET T-gate according to aspects of the present disclosure.

Figure 7F:
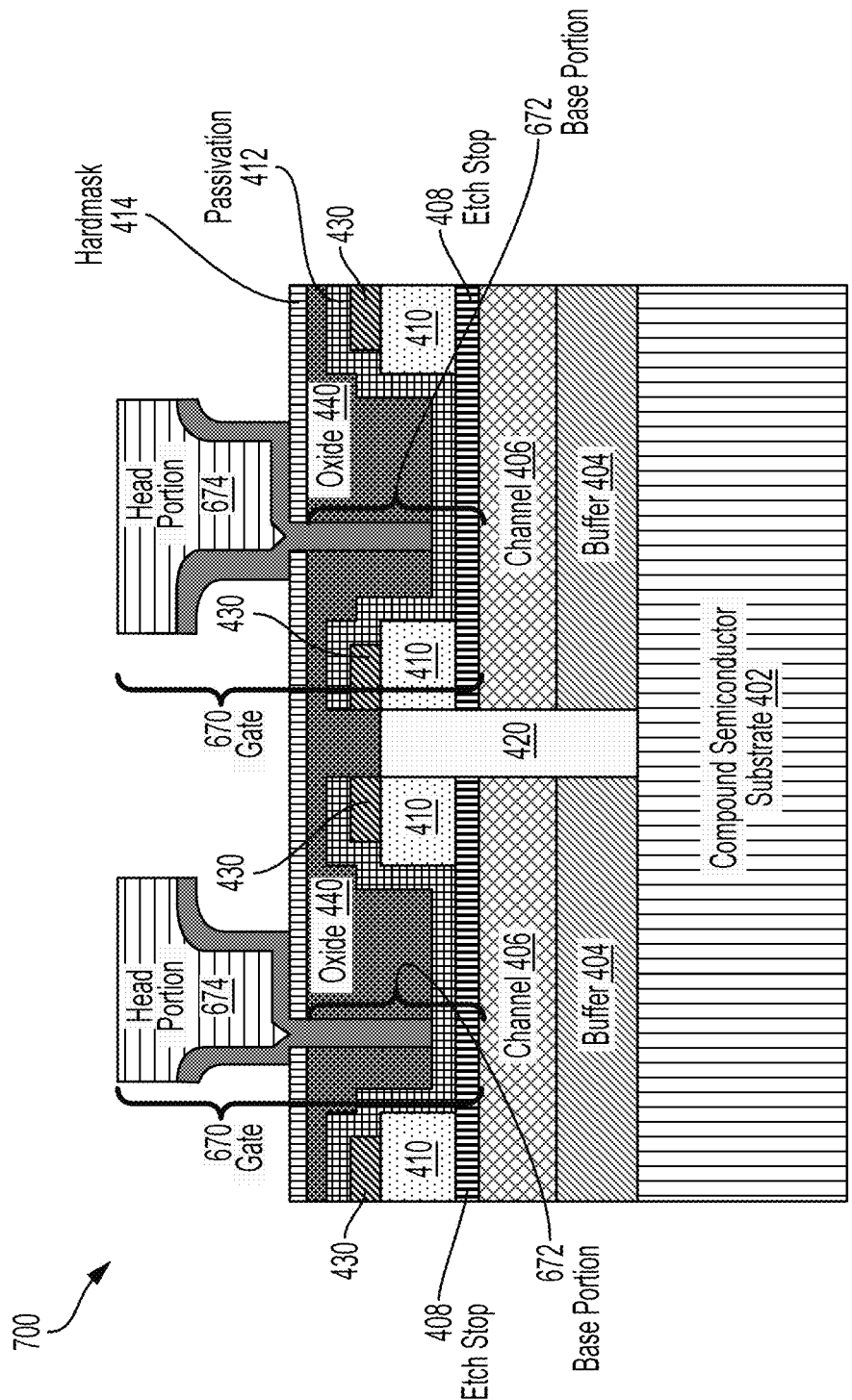

FIG. 7F illustrates a portion of the compound semiconductor FET 600 after step 721b of the gate length scaling process 700 to form MOSFET T-gates according to aspects of the present disclosure. A stripping process may be performed to remove the first resist layer 662 and the second resist layer 665. In addition, an etch process is performed to remove portions of the first gate material 664, so that remaining portions of the first gate material 664 provide a seed layer for the head portion 674 of a gate 670. In this arrangement, the head portion 674 of the gate 670 is also supported by the hard mask 414 and the first oxide layer 440. In addition, the base portion 672 extends through the hard mask 414 and the first oxide layer 440, stopping on the passivation layer 412, which enables formation of the gate 670 as a MOSFET T-gate.

Figure 7G:
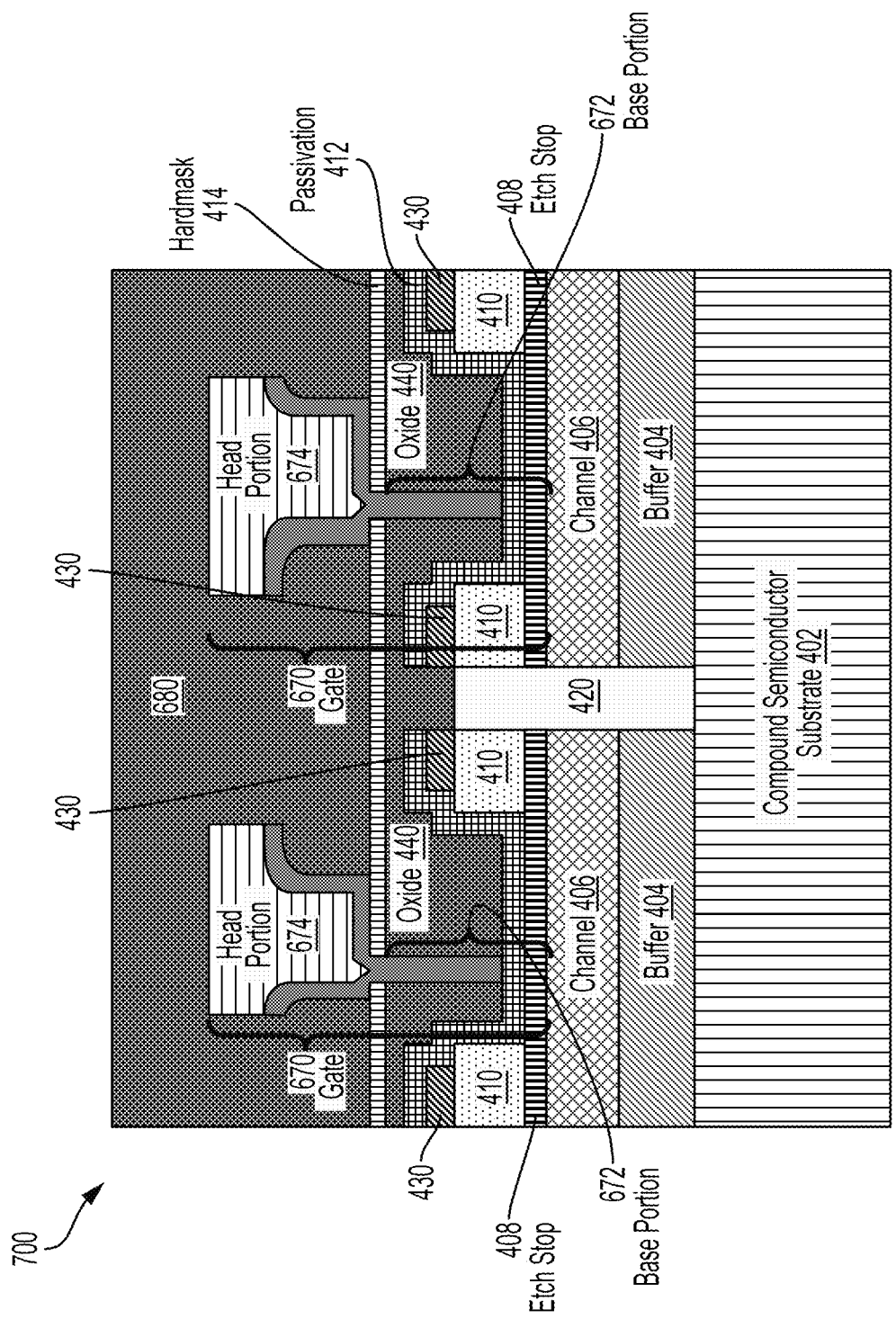

FIG. 7G illustrates a portion of the compound semiconductor FET 600 after step 722b of the gate length scaling process 700 to complete formation of MOSFET T-gates according to aspects of the present disclosure. Formation of the gate 670 is completed by depositing a dielectric layer 680 to cover the compound semiconductor FET 600. The gate 670 may be an asymmetric MOSFET T-gate including the base portion 672 and the head portion 674. The configuration of the gate 670 may also improve a breakdown voltage of the compound semiconductor FET 600, while reducing a source-gate resistance and improving a transmission frequency/maximum frequency (Ft/Fmax).

Figure 8:
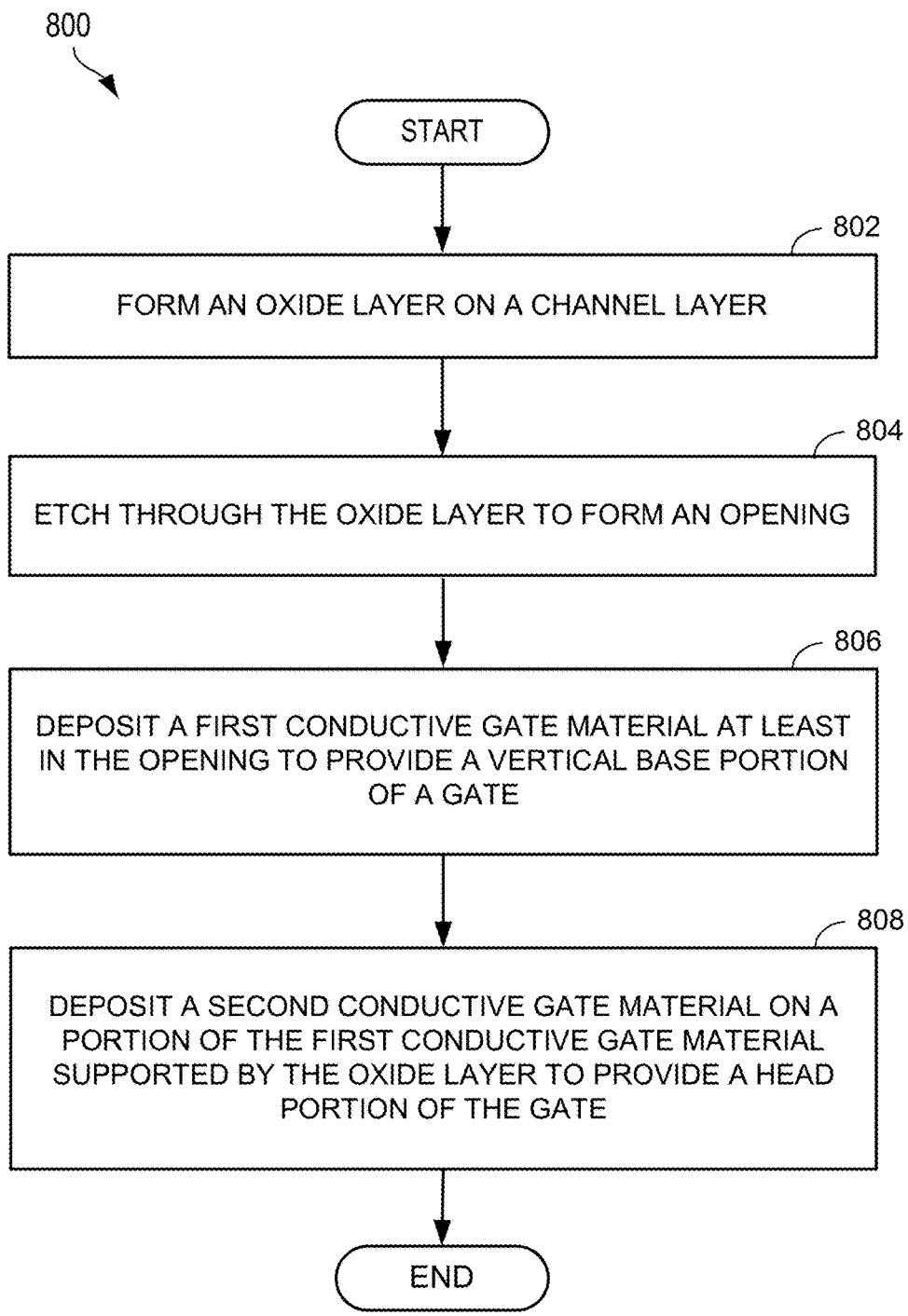
FIG. 8 is a flow diagram illustrating a method of making a compound semiconductor field effect transistor (FET), in accordance with aspects of the present disclosure.

FIG. 8 is a flow diagram illustrating a method 800 of making a compound semiconductor field effect transistor (FET), including a two-portion gate, in accordance with aspects of the present disclosure. The blocks in the method 800 can be performed in or out of the order shown, and in some aspects, can be performed at least in part in parallel.

The method 800 begins at block 802, where an oxide layer is formed on a channel layer. For example, as shown in step 506 of FIG. 5F, a spin-on oxide is deposited on the passivation layer 412 to provide a first oxide layer 440. The first oxide layer 440 may be formed by initially depositing a liquid oxide material and baking the liquid oxide material to form the first oxide layer 440. At block 804, the oxide layer is etched through to form an opening in the oxide layer. For example, as shown in step 517a of FIG. 5Q, openings 462 (e.g., a cavity) may expose portions of the channel 406 through the etch stop layer 408 and the passivation layer for a high electron mobility transistor (HEMT) Schottky gate configuration. Alternatively, the openings 660 may stop on an oxide layer, such as the passivation layer 412 to form cavities for the MOSFET configuration, as shown in steps 716b-723b in FIGS. 6 and 7A-7G.

Referring again to FIG. 8, at block 806, a first conductive gate material is deposited at least in the opening to provide a vertical base portion of a gate. For example, as shown in step 518a of FIG. 5R, the first gate material 468 (e.g., titanium nitride TiN or tungsten silicon nitride (WSiN)) is deposited in the openings 462 and on an exposed portion of the channel 406. Alternatively, the first gate material 664 is deposited in the openings 460 and on an exposed portion of the passivation layer 412, through the first oxide layer 440, as shown in FIG. 7C. At block 808, a second conductive gate material is deposited on a portion of the first conductive gate material supported by the oxide layer to provide a head portion of the gate. For example, as shown in step 520a of FIG. 5T, a second conductive gate material (e.g., gold (Au)) is formed on a portion of the first conductive gate material to form a Schottky gate. Alternatively, as shown in step 720b of FIG. 7E, a second conductive gate material (e.g., gold (Au)) is formed on a portion of the first gate material 664 to form a MOSFET gate that may be scaled to one-tenth of a micron (e.g., 0.1 µm).

According to additional aspects of the present disclosure, a compound semiconductor material may include, but is not limited to, gallium arsenide (GaAs), indium phosphide (InP), gallium nitride (GaN), gallium stibium (GaSb), gallium phosphide (GaP), indium gallium arsenide (InGaAs), aluminum gallium arsenide (AlGaAs), indium gallium phosphide (InGaP), aluminum gallium phosphide (AsGaP), aluminum gallium stibium (AlGaSb), indium gallium stibium (InGaSb), indium gallium nitride (InGaN), aluminum gallium nitride (AlGaN), indium gallium arsenide phosphide (InGaAsP), indium gallium arsenide stibium (InGaAsSb), or indium gallium arsenide:nitride (InGaAs:N). These are exemplary only, and other materials are possible.

According to a further aspect of the present disclosure, a compound semiconductor FET is described. The compound semiconductor FET may include means for supporting the compound semiconductor FET. The supporting means may, for example, include a compound semiconductor substrate, as shown in FIGS. 4 and 6. In another aspect, the aforementioned means may be any layer, module, or any apparatus configured to perform the functions recited by the aforementioned means.

Figure 9:
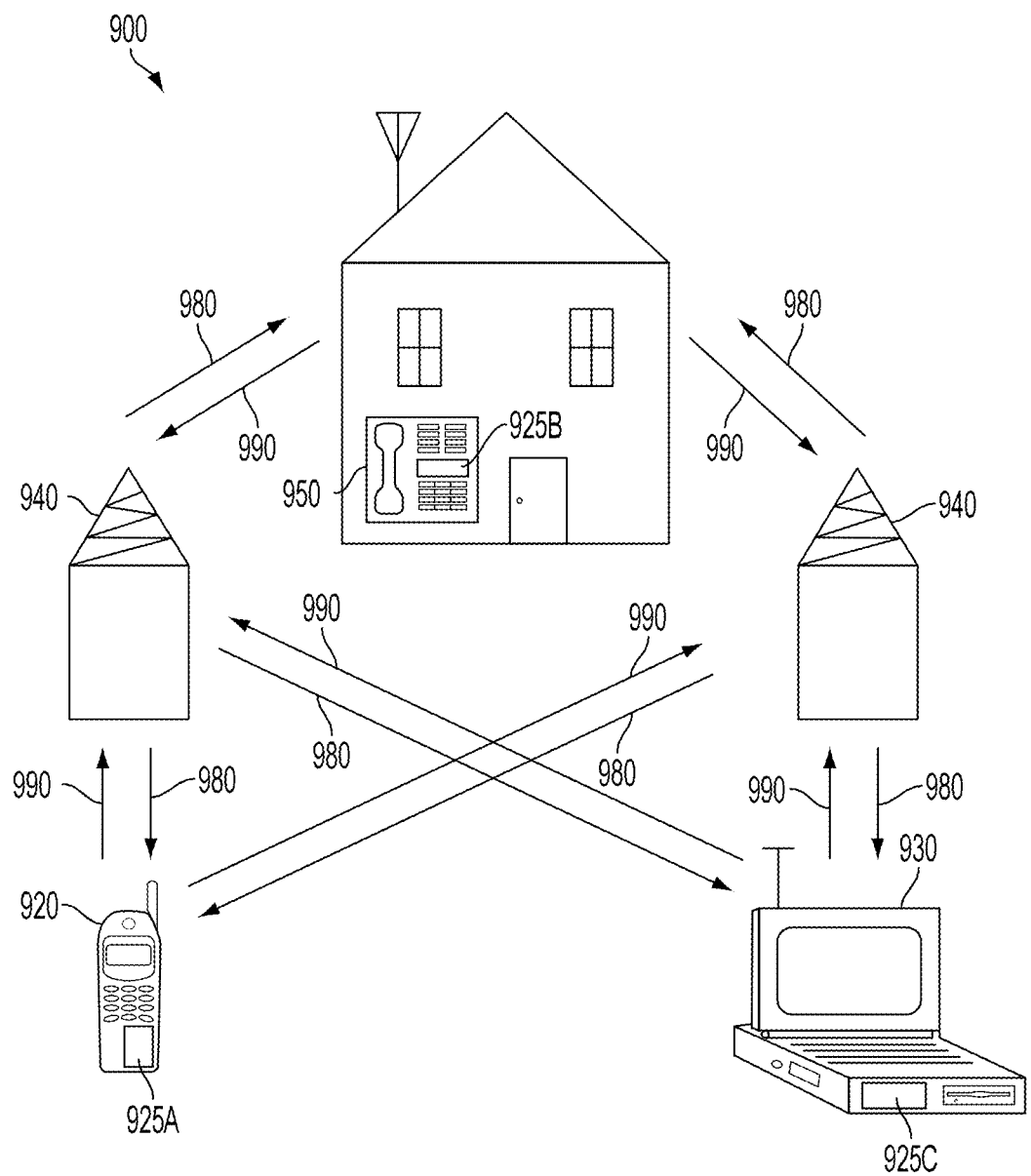
FIG. 9 is a block diagram showing an exemplary wireless communication system in which an aspect of the disclosure may be advantageously employed.

FIG. 9 is a block diagram showing an exemplary wireless communication system 900 in which an aspect of the disclosure may be advantageously employed. For purposes of illustration, FIG. 9 shows three remote units 920, 930, and 950 and two base stations 940. It will be recognized that wireless communication systems may have many more remote units and base stations. Remote units 920, 930, and 950 include IC devices 925A, 925C, and 925B that include the disclosed compound semiconductor field effect transistors. It will be recognized that other devices may also include the disclosed compound semiconductor field effect transistors, such as the base stations, user equipment, and network equipment. FIG. 9 shows forward link signals 980 from the base station 940 to the remote units 920, 930, and 950 and reverse link signals 990 from the remote units 920, 930, and 950 to base station 940.

In FIG. 9, remote unit 920 is shown as a mobile telephone, remote unit 930 is shown as a portable computer, and remote unit 950 is shown as a fixed location remote unit in a wireless local loop system. For example, a remote units may be a mobile phone, a hand-held personal communication systems (PCS) unit, a portable data unit such as a personal digital assistant (PDA), a GPS enabled device, a navigation device, a set top box, a music player, a video player, an entertainment unit, a fixed location data unit such as a meter reading equipment, or other communications device that stores or retrieve data or computer instructions, or combinations thereof. Although FIG. 9 illustrates remote units according to the aspects of the disclosure, the disclosure is not limited to these exemplary illustrated units. Aspects of the disclosure may be suitably employed in many devices, which include the disclosed compound semiconductor field effect transistors.

The accompanying claims and their equivalents are intended to cover such forms or modifications as would fall within the scope and spirit of the protection. For example, the example apparatuses, methods, and systems disclosed herein may be applied to multi-SIM wireless devices subscribing to multiple communication networks and/or communication technologies. The apparatuses, methods, and systems disclosed may also be implemented digitally and differentially, among others. The various components illustrated in the figures may be implemented as, for example, but not limited to, software and/or firmware on a processor, ASIC/FPGA/DSP, or dedicated hardware. Also, the features and attributes of the specific example aspects disclosed above may be combined in different ways to form additional aspects, all of which fall within the scope of the present disclosure.

The foregoing method descriptions and the process flow diagrams are provided merely as illustrative examples and are not intended to require or imply that the operations of the method must be performed in the order presented. Certain of the operations may be performed in various orders. Words such as "thereafter," "then," "next," etc., are not intended to limit the order of the operations; these words are simply used to guide the reader through the description of the methods.

The various illustrative logical blocks, modules, circuits, and operations described in connection with the aspects disclosed herein may be implemented as electronic hardware, computer software, or combinations of both. To clearly illustrate this interchangeability of hardware and software, various illustrative components, blocks, modules, circuits, and operations have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The hardware used to implement the various illustrative logics, logical blocks, modules, and circuits described in connection with the various aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of receiver devices, e.g., a combination of a DSP and a microprocessor, a plurality of microprocessors, one or more microprocessors in conjunction with a DSP core, or any other such configuration. Alternatively, some operations or methods may be performed by circuitry that is specific to a given function.

In one or more exemplary aspects, the functions described herein may be implemented in hardware, software, firmware, or any combination thereof. If implemented in software, the functions may be stored as one or more instructions or code on a non-transitory computer-readable storage medium or non-transitory processor-readable storage medium. The operations of a method or algorithm disclosed herein may be embodied in processor-executable instructions that may reside on a non-transitory computer-readable or processor-readable storage medium. Non-transitory computer-readable or processor-readable storage media may be any storage media that may be accessed by a computer or a processor. By way of example but not limitation, such non-transitory computer-readable or processor-readable storage media may include random access memory (RAM), read-only memory (ROM), electrically erasable programmable read-only memory (EEPROM), FLASH memory, CD-ROM or other optical disk storage, magnetic disk storage or other magnetic storage devices, or any other medium that may be used to store desired program code in the form of instructions or data structures and that may be accessed by a computer. Disk and disc, as used herein, includes compact disc (CD), laser disc, optical disc, digital versatile disc (DVD), floppy disk, and Blu-ray disc where disks usually reproduce data magnetically, while discs reproduce data optically with lasers. Combinations of the above are also included within the scope of non-transitory computer-readable and processor-readable media. Additionally, the operations of a method or algorithm may reside as one or any combination and/or set of codes and/or instructions on a non-transitory processor-readable storage medium and/or computer-readable storage medium, which may be incorporated into a computer program product.

Although the present disclosure provides certain example aspects and applications, other aspects that are apparent to those of ordinary skill in the art, including aspects which do not provide all of the features and advantages set forth herein, are also within the scope of this disclosure. For example, the apparatuses, methods, and systems described herein may be performed digitally and differentially, among others. Accordingly, the scope of the present disclosure is intended to be defined only by reference to the appended claims.

What is claimed is:

1. A compound semiconductor transistor, comprising:
   a channel layer;
   a dielectric layer on the channel layer;
   a gate, comprising a vertical base portion through the dielectric layer and electrically contacting the channel layer, and a head portion on the dielectric layer and electrically coupled to the vertical base portion of the gate; and
   an etch stop layer on the channel layer, in which the dielectric layer fills a cavity between the etch stop layer and a source/drain region of the compound semiconductor transistor.

2. The compound semiconductor transistor of claim 1, in which the gate comprises an asymmetric T-gate, a symmetric T-gate, or a gamma gate.

3. The compound semiconductor transistor of claim 1, in which the etch stop layer is directly on the channel layer, and in which the dielectric layer is on a passivation layer in the cavity adjacent to the etch stop layer, and the passivation layer is on the etch stop layer and a sidewall of the source/drain region of the compound semiconductor transistor.

4. The compound semiconductor transistor of claim 1, in which the compound semiconductor transistor comprises a high electron mobility transistor (HEMT) or a pseudomorphic high electron mobility transistor (pHEMT).

5. The compound semiconductor transistor of claim 1, in which a semiconductor portion of a source/drain region of the compound semiconductor transistor is self-aligned with the vertical base portion of the gate.

6. The compound semiconductor transistor of claim 1, in which the gate comprises a Schottky gate or a metal oxide semiconductor field effect transistor (MOSFET) gate.

7. The compound semiconductor transistor of claim 1, integrated into a power amplifier.

8. The compound semiconductor transistor of claim 7, in which the power amplifier is incorporated into at least one of a music player, a video player, an entertainment unit, a navigation device, a communications device, a personal digital assistant (PDA), a fixed location data unit, a mobile phone, and a portable computer.

9. A radio frequency (RF) front end module, comprising:
   a chip, comprising a compound semiconductor transistor, comprising a channel layer, a dielectric layer on the channel layer, and a gate, comprising a vertical base portion through the dielectric layer and electrically contacting the channel layer, a head portion on the dielectric layer and electrically coupled to the vertical base portion of the gate, and an etch stop layer on the channel layer, in which the dielectric layer fills a cavity between the etch stop layer and a source/drain region of the compound semiconductor transistor; and
   an antenna coupled to an output of the chip.

10. The RF front end module of claim 9, in which the gate comprises an asymmetric T-gate, a symmetric T-gate, or a gamma gate.

11. The RF front end module of claim 9, in which the etch stop layer is directly on the channel layer, and in which the oxide layer is on a passivation layer in the cavity adjacent to the etch stop layer, and the passivation layer is on the etch stop layer and a sidewall of the source/drain region of the compound semiconductor transistor.

12. The RF front end module of claim 9, in which the compound semiconductor transistor comprises a high electron mobility transistor (HEMT) or a pseudomorphic high electron mobility transistor (pHEMT).

13. The RF front end module of claim 9, in which a semiconductor portion of a source/drain region of the compound semiconductor transistor is self-aligned with the vertical base portion of the gate.

14. The RF front end module of claim 9, incorporated into at least one of a music player, a video player, an entertainment unit, a navigation device, a communications device, a personal digital assistant (PDA), a fixed location data unit, a mobile phone, and a portable computer.

* * * * *